United States Patent
Kumasaka et al.

(10) Patent No.: US 7,336,585 B2
(45) Date of Patent: Feb. 26, 2008

(54) INFORMATION RECORDING APPARATUS AND METHOD FOR RECORDING INFORMATION AND INFORMATION RECORDING MEDIUM

(75) Inventors: Osamu Kumasaka, Koufu (JP); Masaki Kobayashi, Koufu (JP); Hiroki Kaneda, Koufu (JP); Masami Sone, Koufu (JP); Kenji Kamimura, Koufu (JP); Kazumi Kuriyama, Koufu (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 11/652,676

(22) Filed: Jan. 12, 2007

(65) Prior Publication Data
US 2007/0115788 A1    May 24, 2007

Related U.S. Application Data

(62) Division of application No. 10/165,953, filed on Jun. 11, 2002, now Pat. No. 7,203,144.

(30) Foreign Application Priority Data

Jun. 11, 2001 (JP) ............................. 2001-175959
Jun. 11, 2001 (JP) ............................. 2001-175960

(51) Int. Cl.
*G11B 7/26* (2006.01)
(52) U.S. Cl. ................................. 369/101; 369/47.49
(58) Field of Classification Search ................ 369/101, 369/47.49
See application file for complete search history.

(56) References Cited

U.S. PATENT DOCUMENTS 5,043,965 A    8/1991  Iida et al.
5,045,438 A    9/1991  Adachi
5,446,722 A    8/1995  Kojima et al.

(Continued)

FOREIGN PATENT DOCUMENTS

JP    06-131706    5/1994

(Continued)

*Primary Examiner*—Gautam R. Patel
(74) *Attorney, Agent, or Firm*—Drinker Biddle & Reath LLP

(57) ABSTRACT

An information recording apparatus for recording tracks includes: a rotation drive section (RDS) that supports and rotates a master disk with a resist layer; an exposure beam emitting section (EBES) deflectably applying an exposure beam to the disk to form a spot thereon; a relative movement drive section (RMDS) translating the RDS relatively to the spot in a radial direction of the disk; an emission controller supplying the EBES with an instruction for modulating an intensity of the exposure beam according to data to be recorded; and a movement controller supplying the RMDS with an instruction for moving the RDS with the rotating disk by a predetermined moving amount for each disk rotation. The apparatus also includes a deflection controller supplying the EBES with instructions for deflection operations for deflecting the exposure beam in a manner that the spot is successively moved from a first exposure start position in either the opposite or the same direction to a moving direction of the RDS and then, at a point in time when the spot has moved up to an exposure stop position of the disk in predetermined rotation thereof, the spot is intermittently moved to a second exposure start position in the moving direction of the RDS, and wherein the spot is periodically returned to the first exposure start position.

6 Claims, 24 Drawing Sheets

U.S. PATENT DOCUMENTS

| | | | |
|---|---|---|---|
| 5,453,594 A * | 9/1995 | Konecny | 219/121.61 |
| 5,821,497 A | 10/1998 | Yamazaki et al. | |
| 5,896,365 A | 4/1999 | Hiroki | |
| 6,034,377 A * | 3/2000 | Pu | 250/492.3 |
| 6,307,826 B1 * | 10/2001 | Katsumura et al. | 369/101 |
| 6,611,492 B2 | 8/2003 | Akimori et al. | |
| 6,650,611 B1 * | 11/2003 | Kamimura et al. | 369/101 |
| 6,754,158 B1 | 6/2004 | Kobayashi et al. | |
| 6,791,938 B2 | 9/2004 | Endoh | |
| 7,200,095 B2 * | 4/2007 | Kojima et al. | 369/101 |
| 7,203,144 B2 * | 4/2007 | Kumasaka et al. | 369/47.49 |

FOREIGN PATENT DOCUMENTS

| | | |
|---|---|---|
| JP | 11-283283 | 10/1999 |
| JP | 2000-20964 | 1/2000 |

* cited by examiner

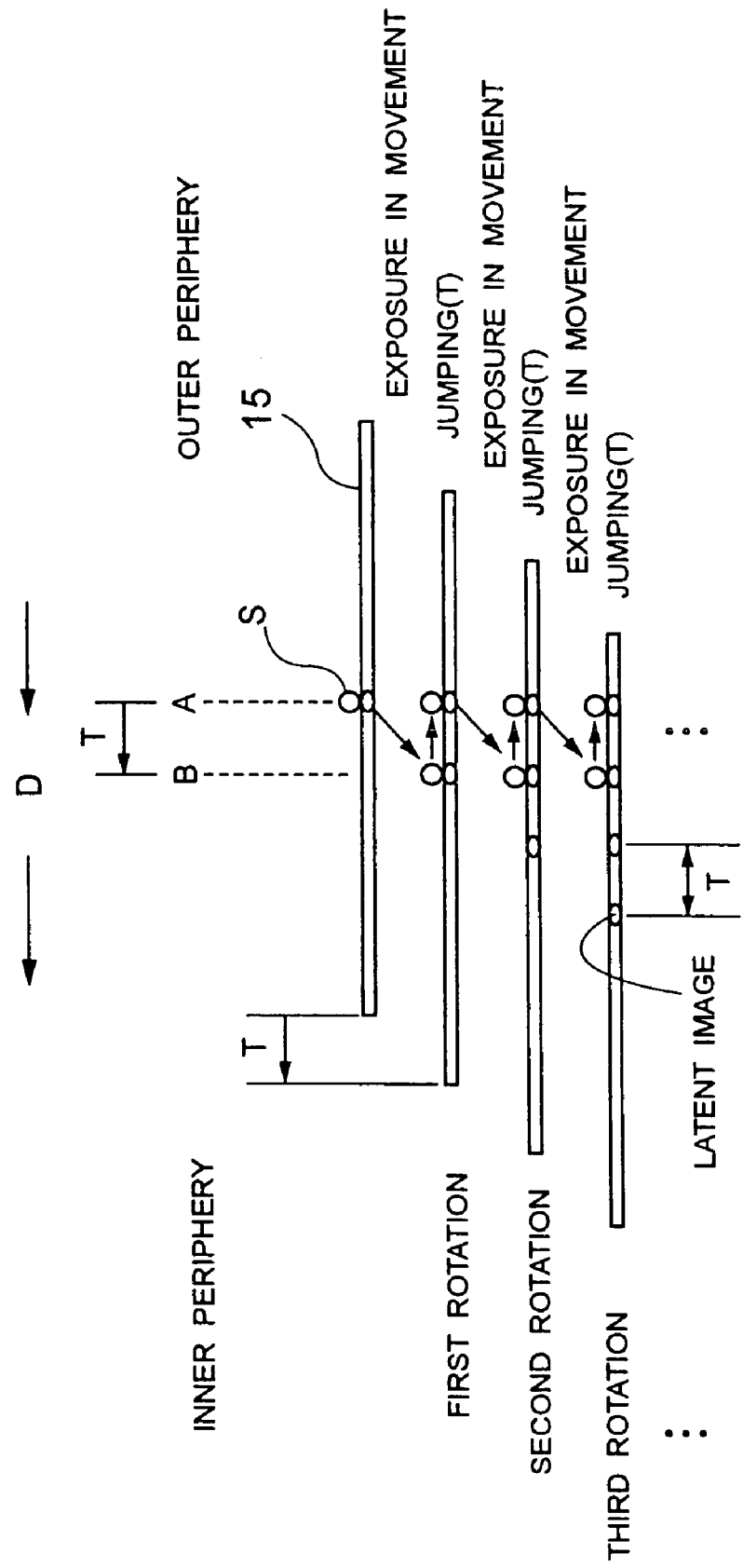

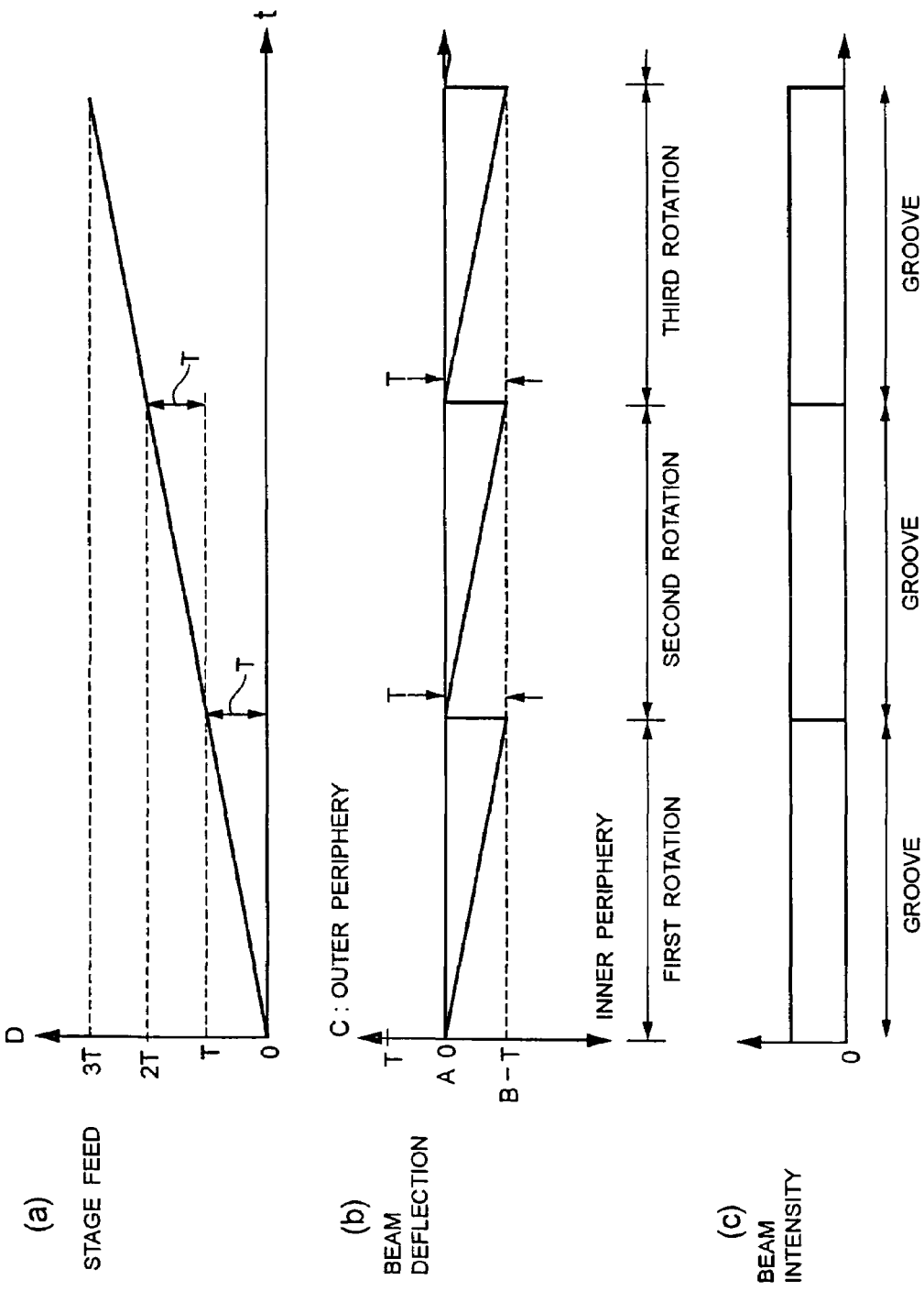

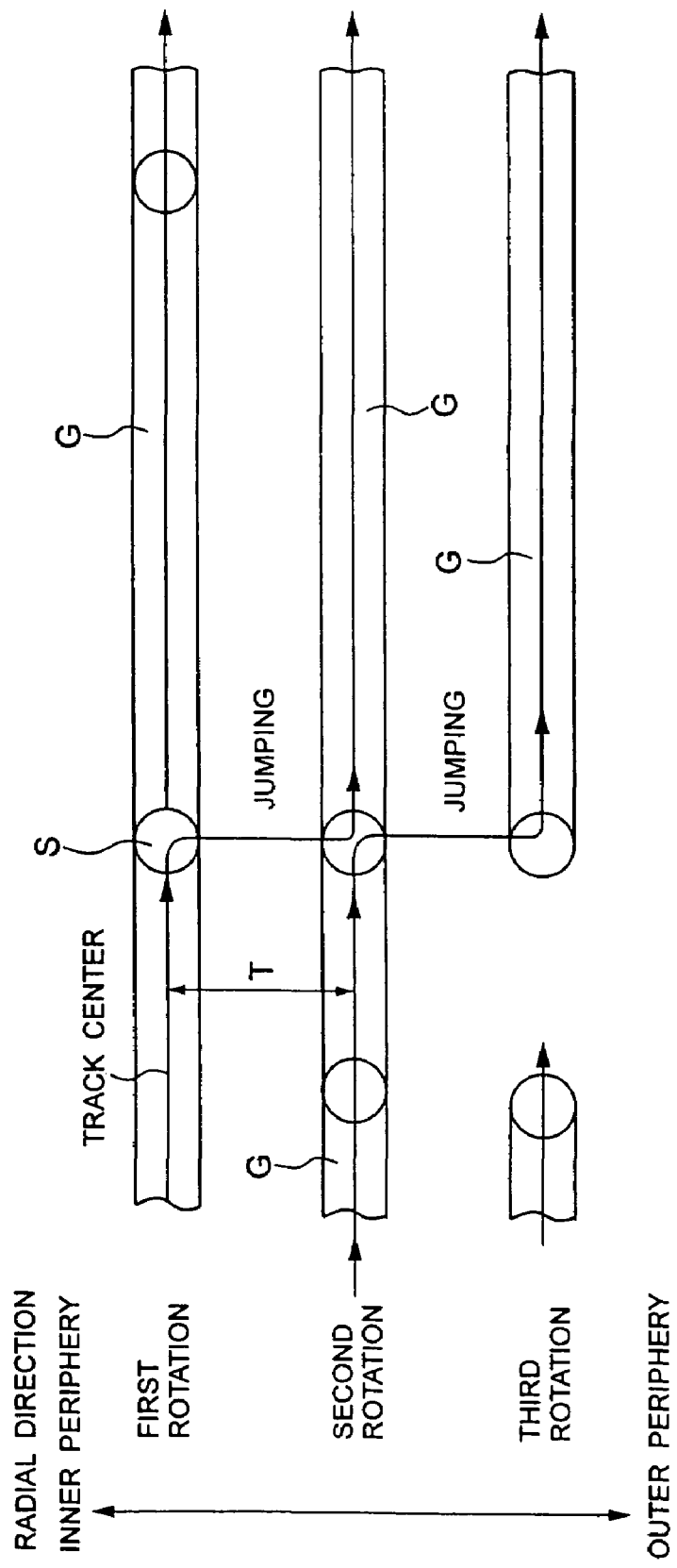

INFORMATION RECORDING APPARATUS AND METHOD FOR RECORDING INFORMATION AND INFORMATION RECORDING MEDIUM

This is a divisional application of application Ser. No. 10/165,953, filed on Jun. 11, 2002, now U.S. Pat. No. 7,203,144 which is incorporated by reference herein in its entirety.

BACKGROUND OF THE INVENTION

1. Field of the Invention

The present invention relates to an information recording apparatus using an exposure beam such as an electron beam, and particularly, to an information recording apparatus and an information recording method using a manufacture apparatus for manufacturing master disks of recording media having tracks, such as optical disks exclusive to reproduction, magneto-optical disks, or phase change type optical disks. The present invention further relates to a recording medium such as an optical disk reproduced from the master disk.

2. Description of the Related Art

Data-recordable optical recording media includes optical disks such a write-once type DVD-R (Digital Versatile Disc-Recordable), and a rewritable type DVD-RW (Digital Versatile Disc-Rewritable). In these optical disks, generally, rotation control information such as a wobbling signal used for the rotation control of an optical disk is previously recorded on tracks constituted of concave or convex portions, i.e., groove tracks or land tracks, when a master disk is produced, as well as a signal such as address information required for position searching in data recording on pre-pits.

For obtaining those optical disks, firstly predetermined concave and convex patterns are formed on a master disk along tracks corresponding to signals, and a disk stamper is formed from the recorded master disk. Then, using the stamper, a light-transmitting substrate and the like are formed by heating press work of a synthetic resin or the like or by injection-molding method, followed by the application of metallic deposition to the recorded surface having the patterns transferred thereon. The recording of the patterns to the master disk has been performed by the following method using an information recording apparatus. While rotating the recording surface, by appropriately feeding a header emitting a laser light beam in the radial direction thereof, a control has been performed such that the irradiating spot of the laser light beam creates track locus that have a spiral form or a concentric circular form at a substantially equidistant pitch. During the formation of the locus of the irradiating spot, the on and off switching of the laser beam is executed according to the rotational speed and the information contents to be recorded, so that the grooves and pre-pits for the information have been recorded on the master desk.

In recent years, research and development of a high-density recording medium excelling DVD in the density is proceeding to meet demand for the miniaturization of pitch in such tracks.

However, in the conventional track cutting of a master disk using a laser beam, that is, mastering, the recording resolution of the spot diameter of the laser beam for recording is limited by the wavelength of the laser beam and the numeral aperture NA of an objective lens.

Accordingly, there is a development and research for a master disk cutting method using exposure to an electron beam having a spot diameter smaller than that of the laser light beam because of an improvement in the recording resolution. For example, Japanese Patent Application kokai No. Hei 11-283283 discloses a method wherein, forming latent images by electronic exposure of a resist layer with which a master disk is coated, the electron beam is alternately deflected and oscillated over a plurality of tracks, and the electron beam is modulated in its intensity so as to be made incident to the resist layer only at the positions to be exposed in a pulsating manner on respective tracks, whereby latent images are simultaneously formed over the plurality of tracks.

Such a conventional method requires the increase of deflection speed for pulses of emitted electron beam and a narrow convergence for a minute electron beam spot. This requirement raises a problem that the electron beam is not absorbed by the resist layer but passes therethrough, so that the exposure amount for each pulse is decreased, resulting in a reduced resolution. Also, in the conventional method, another problem has occurred that, since discrete latent images caused by the electron beam pulses are connected to one another, side surfaces of grooves or the like after a master disk has been developed cannot be smoothly formed. Additionally, the recording using the single oscillated electron beam in the conventional method has a drawback such that it is impossible to form latent image lines which are mutually different in the thickness for the pre-pits and grooves carrying mutually different information.

Moreover, Japanese Patent 3040887 (Patent Application kokai No. Hei 6-131706) discloses an electron beam exposure device wherein, so as to form latent images concentrically circular track patterns, the electron beam exposure process is preformed to the resist layer in such a manner that a stationary electron beam is irradiated to the recording surface of the rotating master disk for one rotation thereof and then, the master disk is shifted by one track pitch and stopped and then the stationary electron beam is irradiated to the recording surface of the rotating master disk for one rotation thereof again, and the master disk is shifted by one track pitch and stopped, and these operations are periodically repeated.

Such a conventional electron beam exposure device produces a drawback of time loss for stabilizing the rotation of the master disk at a predetermined position for starting the exposure because there is a rapid deceleration of the master disk in the stop period between traveling periods thereof. Further since the conventional electron beam exposure device requires a high precision of the master disk's position for electron beam exposure, it is difficult to produce concentrically circular track patterns with a high accuracy.

OBJECTS AND SUMMARY OF THE INVENTION

Accordingly, it is an object of the present invention to provide an information recording apparatus and an information recording method for the manufacturing apparatus which manufactures master disks of recording media, capable of producing patterns such as pre-pits and grooves with a high accuracy. Another object of the present invention is to provide an information recording apparatus and an information recording method for the manufacturing apparatus which manufactures master disks of recording media, capable of producing concentrically circular track patterns with a high accuracy.

According to one aspect of the present invention, there is provided an information recording apparatus for recording tracks comprising a rotation drive section that supports and rotates a master disk having a resist layer formed thereon, an exposure beam emitting section that deflectably applied an exposure beam to the master disk to form a spot thereon, and a relative movement drive section that translates the rotation drive section relatively to the spot in a radial direction of the master disk. This information recording apparatus further includes an emission controller that supplies the exposure beam emitting section with an instruction for modulating an intensity of the exposure beam according to data to be recorded; a movement controller that supplies the relative movement drive section with an instruction for moving the rotation drive section together with the rotating master disk by a predetermined moving amount for each rotation thereof. This information recording apparatus further includes a deflection controller that supplies the exposure beam emitting section with instructions for deflection operations for deflecting the exposure beam in a manner that the spot is successively moved from a first exposure start position in an opposite direction to a moving direction of the rotation drive section and then, at a point in time when the spot has moved up to an exposure stop position of the master disk in a predetermined rotation thereof, the spot is intermittently moved to a second exposure start position in the moving direction of the rotation drive section, and wherein the spot is periodically returned to the first exposure start position, by successively moving the spot from the second exposure start position in said opposite direction.

In the information recording apparatus above mentioned, a deflected moving amount of the spot in the radial direction for each rotation of the master disk is a distance equivalent to the predetermined moving amount of the rotation drive section.

In the information recording apparatus above mentioned, the predetermined moving amount of the rotation drive section is a distance covered by 1/n (where "n" is an integral number) of one track pitch for each rotation of the master disk, and wherein the deflected moving amount of the spot on the radius of the master disk for each rotation of the master disk is a distance covered by 1/n (where "n" is an integral number) of the one track pitch.

In the information recording apparatus above mentioned, the number of the determined rotations of the master disk up to the exposure stop position is an integral number.

In the information recording apparatus above mentioned, the exposure stop position is distant from the first exposure start position by an integral multiple of a distance equivalent to the predetermined moving amount of the rotation drive section.

In the information recording apparatus above mentioned, the second exposure start position coincides with the first exposure start position.

In the information recording apparatus above mentioned, the second exposure start position is distant from the exposure stop position by an integral multiple of a distance equivalent to the predetermined moving amount of the rotation drive section, beyond the first exposure start position.

In the information recording apparatus above mentioned, the second exposure start position is a position located in the range within the diameter of the spot about the position that is distant from the exposure stop position by an integral multiple of a distance equivalent to the predetermined moving amount of the rotation drive section, beyond the first exposure start position.

In the information recording apparatus above mentioned, the second exposure start position is a position located in the range outside the diameter of the spot about the position that is distant from the exposure stop position by an integral multiple of a distance equivalent to the predetermined moving amount of the rotation drive section, beyond the first exposure start position, and wherein the locus of the spots and the spot are equidistantly spaced from each other so that the locus of the spots do not overlap with the spot.

In the information recording apparatus above mentioned, at a point in time when the spot that is successively moved from the second exposure start position in said opposite direction has moved up to the second exposure stop position, the spot is periodically returned to the first exposure start position by intermittently moving the spot.

In the information recording apparatus above mentioned, the exposure beam emitting section emits an electron beam as an exposure beam.

According to another aspect of the present invention, there is provided an information recording method for producing latent images of concave and convex patterns for recording tracks, using the information recording apparatus. This information recording method comprises the step of successively moving the master disk having a resist layer formed thereon in the redial direction thereof at a predetermined moving amount covered by a predetermined track pitch number for each rotation of the master disk while rotating the master disk and moving the spot from a first exposure start position in an opposite direction to a moving direction of the master disk by deflecting the exposure beam according to data to be recorded; the step of intermittently moving the spot to a second exposure start position in the moving direction of the rotation drive section, at a point in time when the spot has moved up to an exposure stop position of the master disk in an predetermined rotation of the master disk; and the step of periodically returning the spot to the first exposure start position by successively moving the spot from the second exposure start position in said opposite direction.

In the information recording method above mentioned, a deflected moving amount of the spot in the radial direction for each rotation of the master disk is a distance equivalent to the predetermined moving amount of the master disk.

In the information recording method above mentioned, the predetermined moving amount of the master disk is a distance covered by 1/n (where "n" is an integral number) of one track pitch for each rotation of the master disk, and wherein the deflected moving amount of the spot on the radius of the master disk for each rotation of the master disk is a distance covered by 1/n (where "n" is an integral number) of the one track pitch.

In the information recording method above mentioned, the number of the determined rotations of the master disk up to the exposure stop position is an integral number.

In the information recording method above mentioned, the exposure stop position is distant from the first exposure start position by an integral multiple of the equal distance to the predetermined moving amount of the master disk.

In the information recording method above mentioned, the second exposure start position coincides with the first exposure start position.

In the information recording method above mentioned, the second exposure start position is distant from the exposure stop position by an integral multiple of a distance equivalent to the predetermined moving amount of the master disk, beyond the first exposure start position.

In the information recording method above mentioned, the second exposure start position is a position located in the range within the diameter of the spot about the position that is distant from the exposure stop position by an integral multiple of a distance equivalent to the predetermined moving amount of the master disk, beyond the first exposure start position.

In the information recording method above mentioned, the second exposure start position is a position located in the range outside the diameter of the spot about the position that is distant from the exposure stop position by an integral multiple of a distance equivalent to the predetermined moving amount of the master disk, beyond the first exposure start position, and wherein the locus of the spots and the spot are equidistantly spaced from each other so that the locus of the spots do not overlap with the spot.

In the information recording method above mentioned, at a point in time when the spot that is successively moved from the second exposure start position in said opposite direction has moved up to the second exposure stop position, the spot is periodically returned to the first exposure start position by intermittently moving the spot.

In the information recording method above mentioned, the exposure beam emitting section emits an electron beam as an exposure beam.

According to a further aspect of the present invention, there is provided a recording medium including a substrate reproduced using a master disk in which predetermined concave and convex patterns are formed along tracks, and a recording layer formed on the substrate, the recording medium being manufactured by a process comprising:

an information recording step of forming a latent image including
  a step of continuously moving the master disk having a resist layer formed thereon in the redial direction the master disk at the predetermined moving amount covered by a predetermined track pitch number for each rotation of the master disk while rotating the master disk,
  a step of, by deflecting the exposure beam, moving the spot thereof in the radial direction of the master disk from a first exposure start position to the an exposure stop position in the direction opposite to the moving direction of the master disk,
  a step of intermittently moving the spot to a second exposure start position for each predetermined rotations of the master disk, and
  a step of periodically returning the spot to the first exposure start position for each predetermined rotations of the master disk by moving the spot from the exposure stop position at the predetermined moving amount;
a developing step of forming concave and convex patterns on the resist layer by developing the latent image formed on the resist layer by the information recording step; and
a transfer step of producing a stamper on which concave and convex patterns have been formed by transferring the concave and convex patterns formed on the resist layer by the developing step.

According to a still further aspect of the present invention, there is provided an information recording apparatus for recording concentric circular tracks comprising:

a rotation drive section that supports and rotates a master disk having a resist layer formed thereon;

an exposure beam emitting section that deflectably applies an exposure beam to the master disk to form a spot of the exposure beam thereon;

a relative movement drive section that translates the rotation drive section relatively to the spot in a radial direction of the master disk;

an emission controller that supplies the exposure beam emitting section with an instruction for modulating an intensity of the exposure beam according to data to be recorded;

a movement controller that supplies the relative movement drive section with an instruction for moving the rotation drive section together with the rotating master disk by a track pitch for each rotation of the master disk; and a deflection controller that supplies the exposure beam emitting section with instructions for deflection operations for deflecting the exposure beam in a manner that the spot is successively moved from an exposure start position in the same direction as a moving direction of the rotation drive section so that a deflected moving amount of the spot in the radial direction is a distance equivalent to the track pitch of the rotation drive section and then, at a point in time when the spot has moved up to an exposure stop position each rotation of the master, the spot is periodically returned to the exposure start position by intermittently moving the spot.

In the information recording apparatus the second mentioned above, the exposure beam emitting section emits an electron beam as an exposure beam.

In the information recording apparatus the second mentioned above, the exposure start position is a position at which the intensity of the exposure beam according to data to be recorded drops in zero.

According to another aspect of the present invention, there is provided an information recording method for producing latent images of concave and convex patterns for recording concentric circular tracks, using the information recording apparatus. This information recording method comprises the steps of:

successively moving the master disk in the redial direction thereof at one track pitch for each rotation of the master disk while rotating the master disk and moving the spot from an exposure start position in the same direction as a moving direction of the master disk by deflecting the exposure beam according to data to be recorded; and intermittently moving the spot to the exposure start position after one rotation of the master disk, at a point in time when the spot has moved up to an exposure stop position of the master disk, so as to periodically return the spot to the exposure start position by intermittently moving the spot each rotation of the master.

In the information recording method the second mentioned above, the exposure beam emitting section emits an electron beam as an exposure beam.

According to a still further aspect of the present invention, there is provided a recording medium including a substrate reproduced using a master disk in which predetermined concave and convex patterns are formed along concentric circular tracks, and a recording layer formed on the substrate, the recording medium being manufactured by a process comprising:

an information recording step of forming a latent image including
  a step of continuously moving the master disk having a resist layer formed thereon in the redial direction the master disk at one track pitch for each rotation of the master disk while rotating the master disk,
  a step of, by deflecting the exposure beam, moving the spot thereof in the radial direction of the master disk from an exposure start position to the an exposure stop position in the same direction as the moving direction of the master disk, and a step of intermittently moving the spot to the exposure start position after one rotation of the master disk, at a point in time when the spot has moved up to an exposure stop position of the master disk, so as to periodically return the spot to the exposure start position by intermittently moving the spot each rotation of the master;

a developing step of forming concave and convex patterns on the resist layer by developing the latent image formed on the resist layer by the information recording step; and a transfer step of producing a stamper on which concave and convex patterns have been formed by transferring the concave and convex patterns formed on the resist layer by the developing step.

The above and other objects, features, and advantages of the present invention will be clear from the following detailed description of the preferred embodiments of the invention in conjunction with the accompanying drawings.

BRIEF DESCRIPTION OF THE DRAWINGS

FIG. 22 is a schematic sectional view showing a state wherein information is being recorded on a master dick in the electron beam recorder according to the ninth embodiment of the present invention;

FIG. 23 is a diagram graphing relations between feed operation of a master disk, beam deflection operation, and a beam recording signal in the ninth embodiment of the present invention; and FIG. 24 is an enlarged partial plan view showing the formation of latent images on a master disk in the electron beam recorder according to the ninth embodiment of the present invention.

DESCRIPTION OF THE PREFERRED EMBODIMENTS

Figure 1:
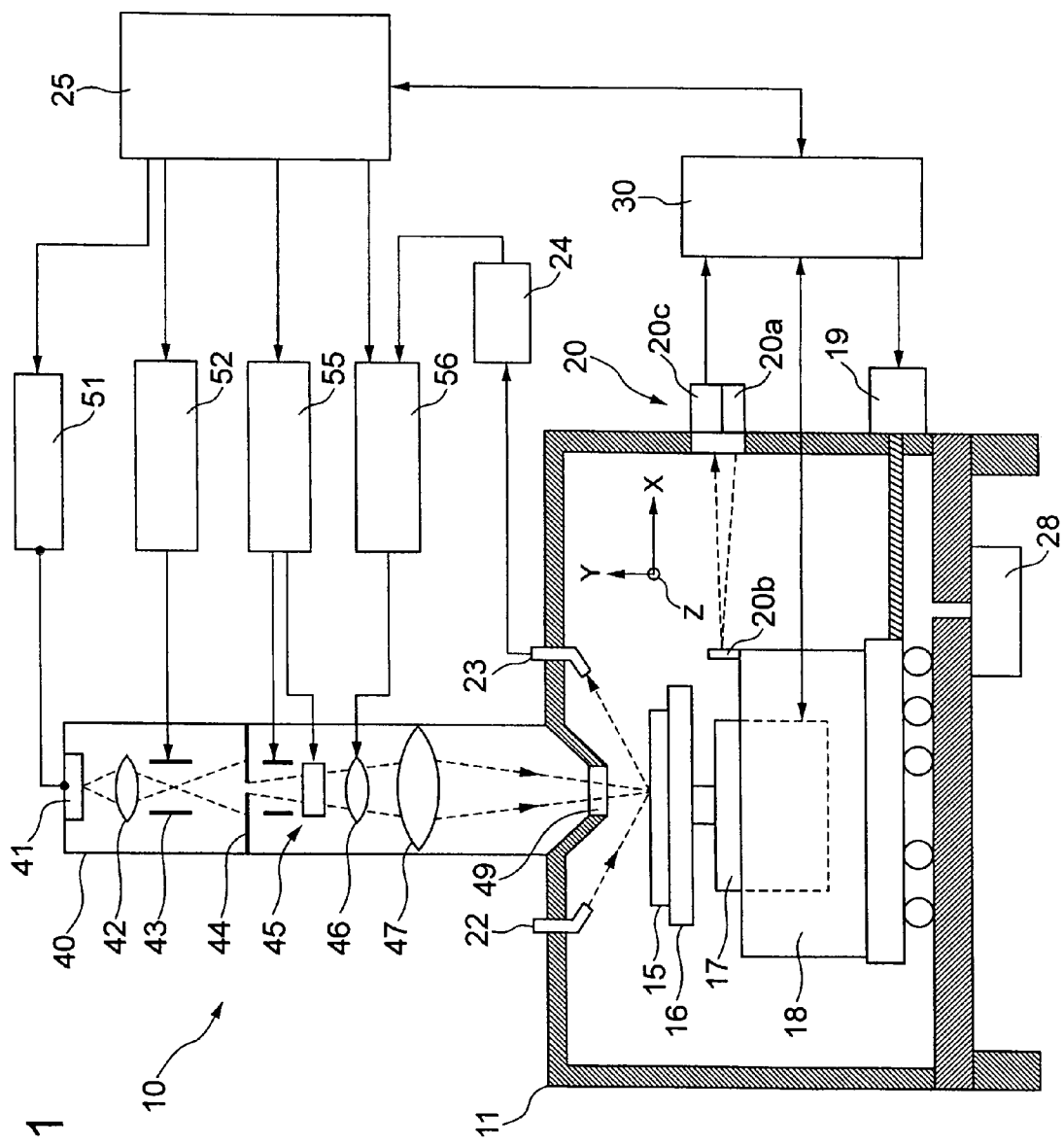
FIG. 1 is a schematic block diagram showing an electron beam recorder using an electron beam according to an embodiment of the present invention.

FIG. 1 is a schematic block diagram showing an information recording apparatus 10 i.e., electron beam recorder according to an embodiment of the present invention.

Generally, electronic exposure is performed in a vacuum atmosphere, since an electron beam has a significant attenuation characteristic in the air. Accordingly, the electron beam recorder 10 has a vacuum chamber 11 for accommodating a driving mechanism that rotates or translates a blank master disk 15 so that these members operate in the vacuum atmosphere. An electron beam column section 40 is provided at a vertically upward portion of the main surface of the master disk 15 so as to irradiate the electron beam to the disk. The electron beam recorder 10 also has external controlling devices of the vacuum chamber 11. A vacuum pump 28 is connected to the vacuum chamber 11 to evacuate the inside thereof, and thereby the vacuum chamber 11 retains the vacuum atmosphere at a predetermined pressure. The vacuum chamber 11 is disposed on a floor via a vibration-isolating base (not shown) such as an air damper, thereby suppressing the transmission of external vibrations. As the blank master disk 15, for example, a silicon wafer substrate is used, and the master disk 15 has a resist layer sensitive to the electron beam previously formed on the main surface thereof.

While the rotating master disk 15 is translated in the horizontal direction, the electron beam column section 40 irradiates the electron beam onto the resist layer thereof. The locus of the electron beam spot applied onto the master disk 15 spirally forms latent images on the resist layer during the translation of the master disk for, e.g., minute concave and convex patterns such as pre-pits and grooves to be recorded in an target optical disk.

<Rotation Drive Section and Relative Movement Drive Section>

Referring to FIG. 1, in the vacuum chamber 11, the master disk 15 is placed on a turntable 16 and rotationally driven by a spindle motor 17. The master disk 15 is rotationally driven about the vertical axis through the center of the main surface thereof. The spindle motor 17 includes a magnetic shield motor with an air-spindle structure that can be driven in a vacuum atmosphere. The spindle motor 17 is mounted on a movable stage 18 that can be linearly moved on a slider.

The movable stage 18 is coupled to a translational driving mechanism 19 comprising a threaded shaft capable of being rotated by a DC motor. Thus the turntable 16 and the spindle motor 17 mounded on the movable stage 18 may be moved in a horizontal plane, parallel to the main surface of the master disk 15.

The spindle motor 17 and the translational driving mechanism 19 are electrically connected to a disk-driving controller 30. The disk driving controller 30 performs a feedback servo control of rotation of the turntable 16 based on an output from an encoder equipped with the spindle motor 17. The disk driving controller also performs a speed control of the movable stage 18 by using a feedback servomechanism of the translational driving mechanism 19 based on a length measurement data from a radius sensor 20 using a laser length measuring device. The disk driving controller 30 performs a control such that the relationship between the rotation number of the spindle motor 17 and the feeding distance due to the translational driving mechanism 19 is retained at a predetermined constant value, using a predetermined track pitch data and length measurement data supplied from the main controller 25. In the radius sensor 20, a laser light source 20a and a photodetector 20c for the radius sensor 20 are provided on an inner surface of the vacuum chamber 11. A reflecting mirror 20b reflecting a laser light is fixed on the movable stage 18.

The disk-driving controller 30 outputs positional data of the master disk 15 to the main controller 25. The main controller 25 has a clock synchronization circuit generating a synchronous clock. The main controller 25 synchronizes the signal of the positional data of the master disk 15 from the disk driving controller 30 with modulated signals corresponding to pre-pits and grooves to be recorded, and supplies such modulated signals to a beam modulator 52 described later. Thereby, the main controller 25 and the disk driving controller 30 move the stage together with the rotating master disk at the predetermined moving amount covered by a predetermined track pitch number for each rotation of the master disk.

Moreover, the main controller 25 synchronizes a deflecting signal for the electron beam with the positional data signal and modulated signal, and outputs this electron beam deflecting signal to a beam deflector 55 described later.

<Exposure Beam Emitting Section>

On the inner surface of the vacuum chamber 11 in the vicinity of the electron beam column section 40, a focus sensor comprising a laser light source 22 and a photodetector 23 are disposed within the incident surface of laser light, and optically detects the height of the main surface of the master disk 15. The photodetector 23 supplies a light-receiving signal to a height level detector 24. The height level detector 24 detects the height data of the main surface of the master disk 15 based on the light receiving signal, and send it to a focus adjustment section 56.

Within the electron beam column section 40 above the vacuum chamber 11, an electron gun 41, a converging lens 42, blanking electrodes 43, an ON/OFF control aperture member 44, beam-deflection electrodes 45, a focus adjustment lens 46, and an objective lens 47 are arranged in this order from above. An electron beam ejection port 49 provided at the front end of the electron beam column section 40 is directed to the master disk 15, and is arranged so that, when an electron beam ejected from the electron gun 41 passes through the ON/OFF control aperture member 44, the electron beam is converged on the main surface of the master disk 15 by the objective lens 47, thereby forming a minute electron beam spot thereon.

The electron gun 41 emits an electron beam accelerated by a high voltage of several tens KeV supplied from an electron gun power supply 51. The converging lens 42 converges the emitted electron beam, and introduces it to the ON/OFF control aperture member 44. The blanking electrodes 43 are controlled by the beam modulator 52, and perform an intensity modulation (ON/OFF control) with respect to the electron beam based on a modulated signal from the main controller 25. That is, the beam modulator 52 applies a voltage between the blanking electrodes by supplying the modulated signal to the blanking electrode 43, and significantly deflects the electron beam passing therethrough. Thereby, the blanking electrodes provide an off-state by blocking the passage of the electron beam to the ON/OFF control aperture member 44, while they provide an on-state by allowing the electron beam to pass to the ON/OFF control aperture member 44.

The beam-deflection electrodes 45 are constituted of electrodes disposed orthogonally to each other, and the electrodes are arranged so that the passing electron beam can be independently deflected in two directions (X and Y), that is, the direction of an axis parallel to the diameter of the master disk in the plane parallel to the disk main surface and the direction of the axis perpendicular to the above-described axis. The two-axis electrodes of the beam-deflection electrodes 45 are controlled by a radial deflection signal X(t) and a tangential deflection signal Y(t) from the beam-deflection electrodes of the beam deflector 55, respectively, and deflect the passing electron beam to the respective axial directions. The beam deflector 55 produces deflection signals X(t) and Y(t) based on electron beam deflection signals from the main controller 25, and thereby, for example, deflects the passing electron beam by the beam-deflection electrodes 45 according to, for example, the radial deflection signal, thereby moving the electron beam spot on the radius of the master disk at the predetermined moving amount covered by a predetermined track pitch number. Moreover, the beam deflector 55 produces deflection signals X(t) and Y(t) by correcting the radius error components based on length measurement data from the radius sensor 20 and rotation number data from the encoder of the spindle motor 17, and also performs a position adjustment of the electron beam spot on the main surface of the master disk 15. In this manner, the beam modulator 52 supplies the beam-deflection electrodes 45 with an instruction for modulating the intensity of an exposure beam according to data to be recorded.

The focus adjustment lens 46 is controlled by the focus adjustment section 56, and the focus adjustment section 56 focuses the electron beam converged on the main surface of the master disk 15 by the objective lens 47, based on a detected signal from the height level detector 24. The electron gun power supply 51 and the focus adjustment section 56 also operate based on control signals from the main controller 25.

First Embodiment

Hereinafter, detailed descriptions will be made of the method wherein latent images of pre-pits and grooves are recorded on the rotating master disk so as to be spirally arranged, using the information recording apparatus of an optical disk according to the present invention.

Figure 2:
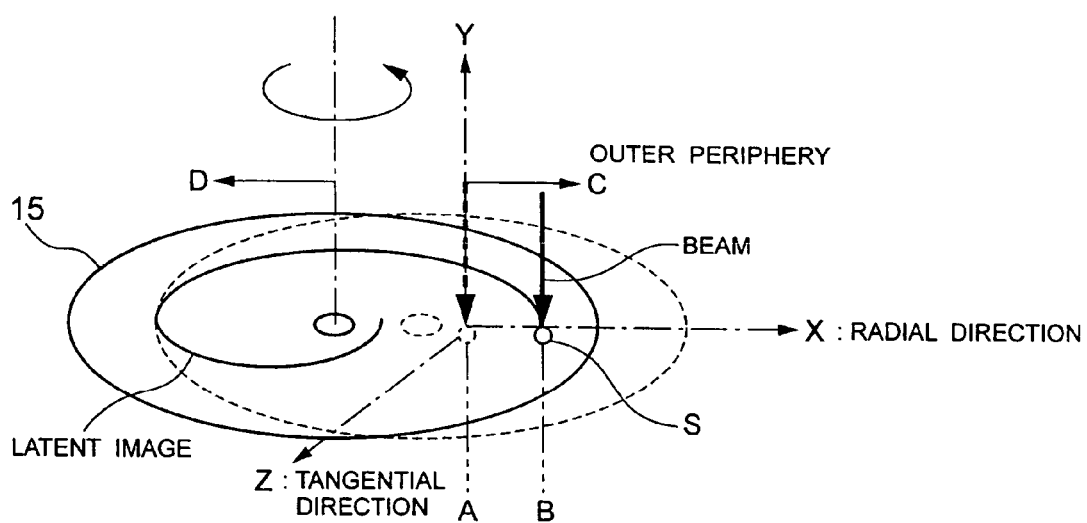
FIG. 2 is a schematic perspective view showing a state wherein information is being recorded on a master dick in the electron beam recorder according to an embodiment of the present invention.

The beam deflector 55 deflects an electron beam by supplying a deflection signal to the beam-deflection electrodes 45, and as shown in FIG. 2, moves the electron beam spot S of the electron beam from a first exposure position "A" to an exposure stop position "B" on the radius of the master disk 15 in the direction "C" opposite to the moving direction "D" of the movable stage 18 (that is, from the inner periphery side to the outer periphery side), at a moving amount SR [track-pitch number/rotation] satisfying the following equation, where the track pitch T covered by the distance equivalent to one rotation of the disk is taken as a standard value (i.e., T=1).

$$|SR|=|CR|$$

Here, CR refers to a moving amount [track-pitch number/rotation] of the movable stage 18 for each rotation of the master disk. The moving amount SR of the electron beam spot on the disk radius for each rotation of the master disk is equal to a predetermined moving amount CR of the movable stage 18. If there should be a differential between SR and CR, the scan range of an electron beam will be limited, so that the differential will inhibit an exposing process by a definite track pitch to be performed. FIG. 2 shows, as an example, a state where the master disk advances by ½ track pitch at one rotation and the electron beam spot S advances by ½ track pitch at one rotation. Thereby, a spiral latent image is formed with a distance of one track pitch for each rotation of the master disk.

Figure 3:
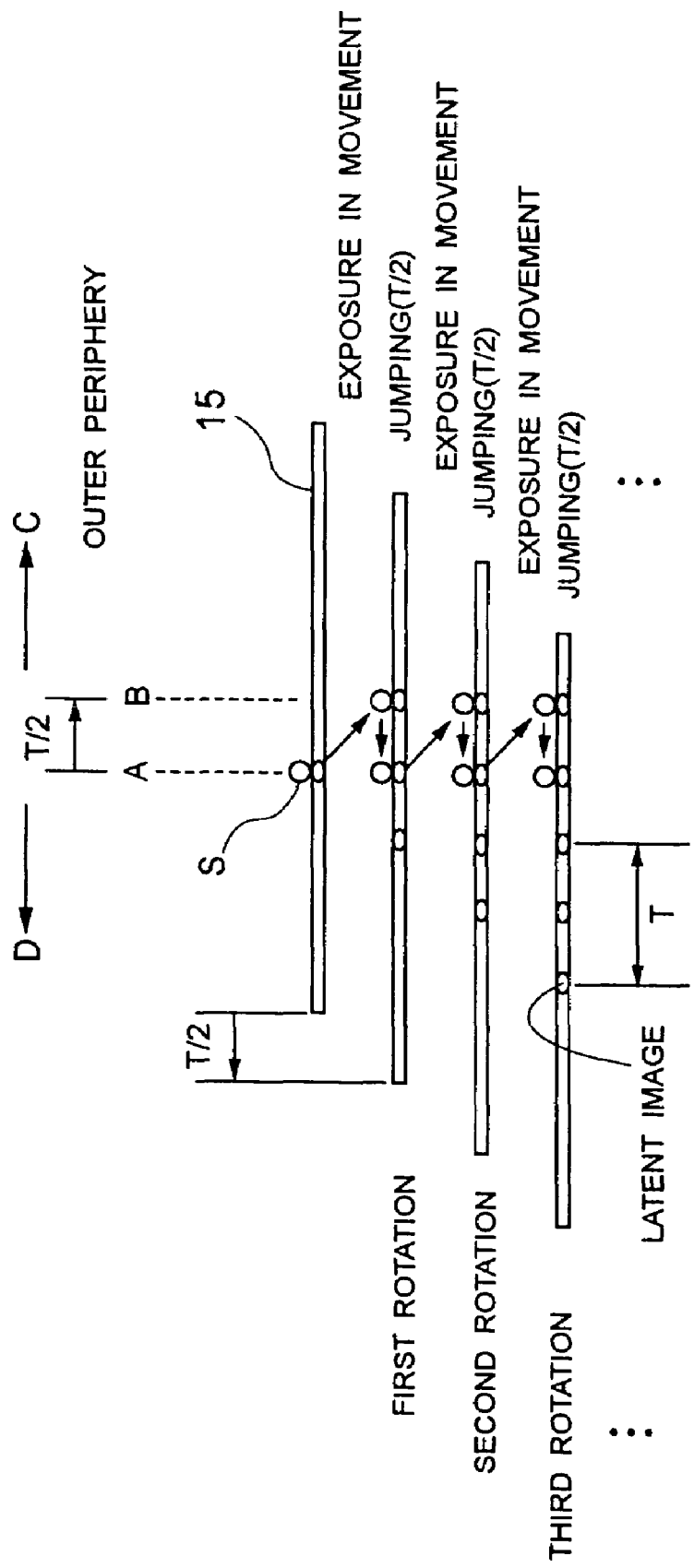
FIG. 3 is a schematic sectional view showing a state wherein information is being recorded on a master dick in the electron beam recorder according to the first embodiment of the present invention.

Specifically, as shown in FIG. 3, while the rotating master disk 15 moves by ½ track pitches (T/2) for each rotation thereof in the direction "D", at a point in time when the electron beam spot S has been moved by T/2 from the first exposure start position "A" in the opposite direction "C" to the outer periphery direction, the electron beam spot S arrives at the exposure stop position "B". Here, the electron beam spot S is intermittently moved, namely, caused to jump to the first exposure start position "A" as a second exposure start position, and is also periodically returned to the exposure stop position "B" for each rotation of the master disk. In this manner, the main controller 25 and the beam deflector 55, i.e., a deflection controller causes the beam-deflection electrodes 45 to perform such deflection operations according to radial deflection signals. Here, the first exposure start position "A" and the exposure stop position "B" are not based on the position of the master disk, but on that of the electron beam column section 40.

Figure 4:
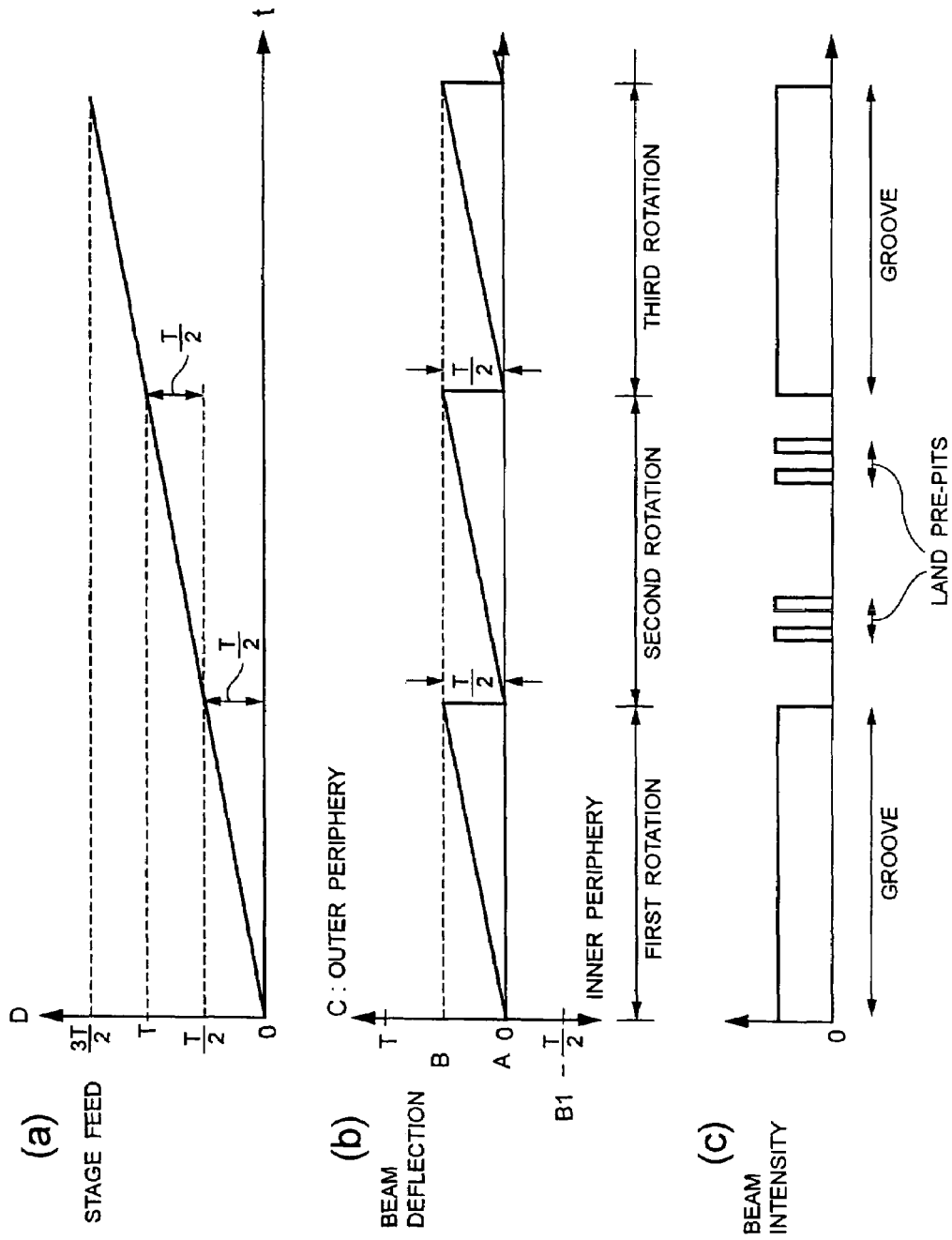
FIG. 4 is a diagram graphing relations between feed operation of a master disk, beam deflection operation, and a beam recording signal in the first embodiment of the present invention.

The disk driving controller 30 shown in FIG. 1 supplies the translational driving mechanism 19 with an instruction for moving the master disk by a predetermined moving amount T/2 per rotation thereof so as to satisfy the relationship between the rotation of the master disk 15 and the feed amount of the stage shown in FIG. 4 (a). Simultaneously, so as to meet the relationship between the rotation of the master disk 15 and the deflection amount of the beam shown in FIG. 4 (b), the beam deflector 55 supplies the beam-deflection electrodes 45 with instructions in sawtooth waveform for performing deflection operations such that the electron beam spot is successively moved from the first exposure start position "A" in the outer periphery direction opposite to the stage feeding direction by the predetermined moving amount T/2 per rotation of the master disk, that, at an exposure stop position "B" in a first rotation, distant from the first exposure start position "A" by T/2, the electron beam spot is periodically returned in the inner periphery direction to a next second exposure start position, that is, the first exposure start position "A", and that the electron beam spot is likewise successively moved from there in the outer periphery direction. Furthermore, so as to meet the relationship between the rotation of the master disk and the beam intensity shown in FIG. 4 (c) in synchronization with the relationships shown in FIGS. 4 (a) and (b), the beam modulator 52 supplies the beam-deflection electrodes 45 with blanking instructions for maintaining a beam intensity whereby the resist layer becomes sensitive for the groove exposure throughout the first rotation, arranging the electron beam spot to have a pulse-modulated beam intensity according to pre-pit data during the second rotation, and maintaining a beam intensity whereby the resist layer becomes sensitive for groove exposure throughout the third rotation.

Figure 5:
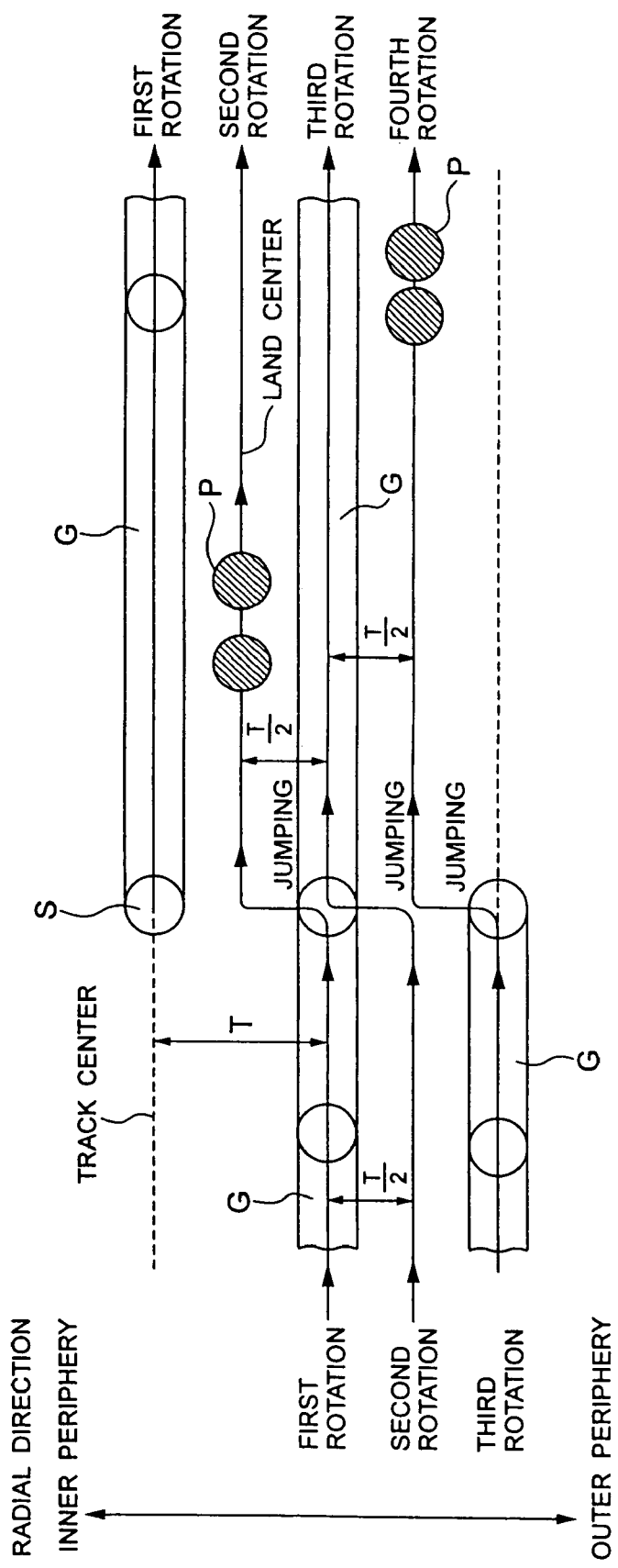
FIG. 5 is an enlarged partial plan view showing the formation of latent images on a master disk in the electron beam recorder according to the first embodiment of the present invention.

As shown in FIG. 5, according to such a series of deflection operations of modulated electron beam spot, a groove latent image G is formed by the locus of the exposure movement of the spot S during the first rotation, land pre-pit latent images P are formed according to pre-pit data in the second rotation, and groove latent images G that are correctly connected after exposure locus during one rotation, are formed during the third rotation. By performing such operations with respect to the entire master disk, an information recording process of forming latent images is completed.

The exposed and recorded master disk having latent images formed on its resist layer is mounted on a developing device, and is developed. After development, latent image portions are removed, and concave and convex patterns are formed on the resist layer, thereby producing a developed master disk. In this embodiment, by synchronizing the electron beam on/off control operation and the deflection operation with respect to the rotating master disk on a slider moving at a definite moving amount, the exposure period of electron beam is divided into a groove exposure period and a pre-pit exposure period, and both the periods are alternately repeated. Therefore, the connection of the exposures of electron beam can be achieved with a high accuracy. This allows side surfaces f grooves and the like after development to be formed smooth.

Next, after the developed master disk has been fixed by post-baking, a conductive film such as nickel or silver is formed on the resist layer by sputtering or deposition, and the concave and convex patterns formed on the resist layer are transferred. Next, for example, a nickel stamper is formed by nickel electroforming, and is separated from a substrate, thereby producing a nickel stamper. By this stamper, a replica of resin optical disk substrate including the same definite pre-pit information is produced by, for example, an injection molding method or a 2P method (so-called a photopolymer method).

On the optical disk substrate thus obtained, for example, a protective film, a phase-change material medium layer, a protective film, and a reflective film are sequentially stacked in this order from below, and this optical disk substrate is adhered to another substrate via an adhesion layer.

Second Embodiment

In the first embodiment, with the second exposure start position being made to agree with the first exposure start position, the groove exposure period and the pre-pit exposure period are alternately repeated, and the land grooves are provided, thereby forming land pre-pits at 2/T. Furthermore, according to the present invention, a target optical disk in a so-called groove pre-pit mode wherein pre-pits are formed within a groove also be manufactured. That is, the second exposure start position of the electron beam spot is caused to jump from the last exposure stop position by a distance equivalent to the predetermined moving amount T/2 of the rotating master disk, beyond the first exposure start position, and thereby re-pit latent images can be formed within grooves.

Figure 6:
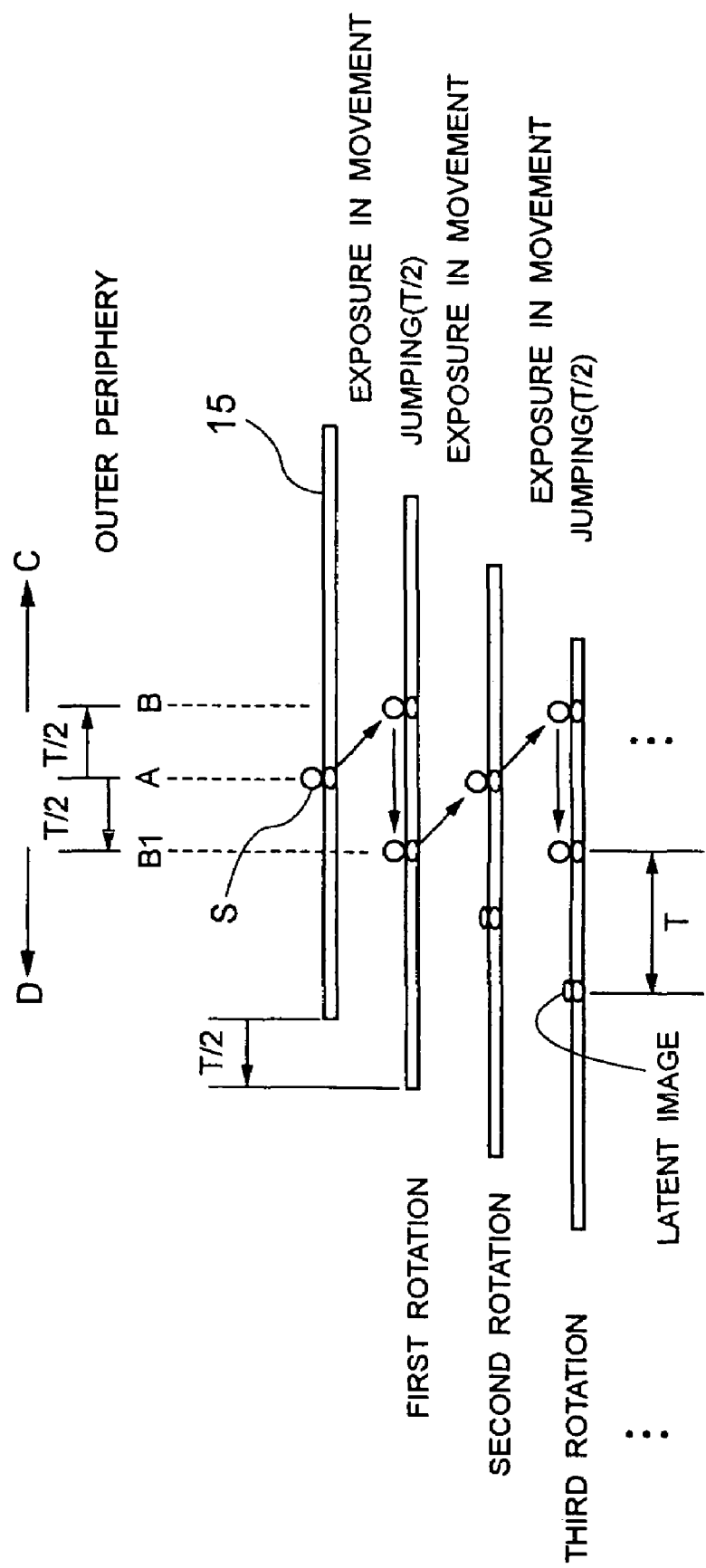
FIG. 6 is a schematic sectional view showing a state wherein information is being recorded on a master dick in the electron beam recorder according to the second embodiment of the present invention.

Specifically, as shown in FIG. 6, during the first rotation, while the rotating master disk 15 is moving in the direction "D" by T/2 for each rotation thereof, the electron beam spot S is successively moved from the first exposure start position "A" in the outer periphery direction "C", and at a point in time when the spot has arrived at the exposure stop position "B" distant by T/2 from the first exposure position "A", the electron beam spot S is caused to jump to a second exposure start position "B1" in the inner periphery direction (the position distant from the exposure stop position "B" by a distance equivalent to T/2, beyond the first exposure start position "A"). During the second rotation, the electron beam spot S is successively moved from the second exposure start position "B1" in the outer periphery direction by T/2 per rotation of the master disk, and traces the locus during the first rotation of the master disk. At the end of the second rotation, since the exposure start position and the exposure stop position agree with each other, the spot returns to the original position. Next, in the third rotation, the electron beam spot is successively moved, and these operations are periodically repeated.

Figure 7:
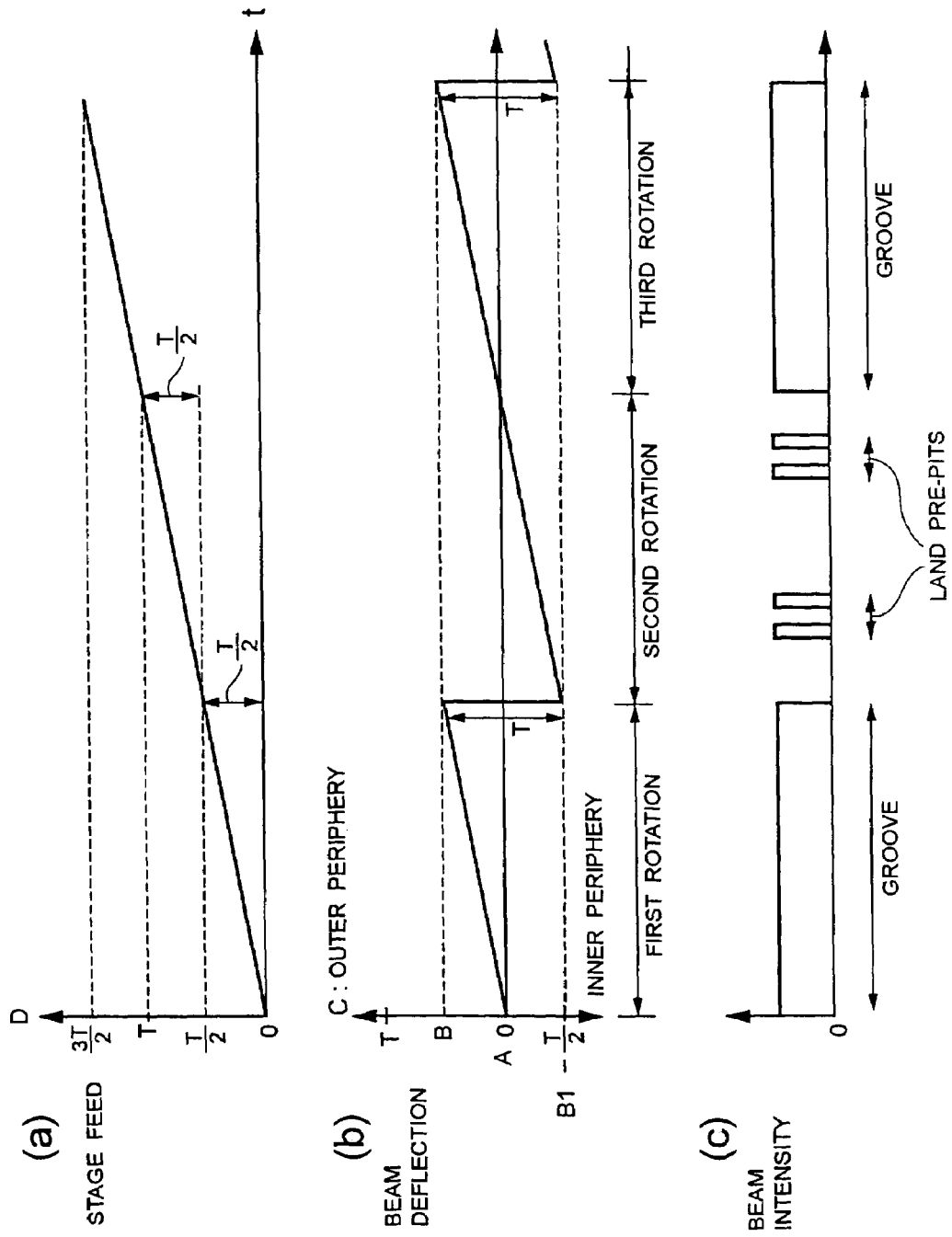
FIG. 7 is a diagram graphing relations between feed operation of a master disk, beam deflection operation, and a beam recording signal in the second embodiment of the present invention.

The disk driving controller 30 shown in FIG. 1 supplies the translational driving mechanism 19 with an instruction for moving the master disk by a predetermined moving amount T/2 per rotation thereof so as to satisfy the relationship between the rotation of the master disk 15 and the feed amount of the stage shown in FIG. 7 (a). Simultaneously, so as to meet the relationship between the rotation of the master disk 15 and the deflection amount of the beam shown in FIG. 7 (b), the beam deflector 55 supplies the beam-deflection electrodes 45 with instructions in sawtooth waveform for performing deflection operations such that the electron beam spot is successively moved from the first exposure start position "A" in the outer periphery direction opposite to the stage feeding direction by the predetermined moving amount T/2 per rotation of the master disk, that, at an exposure stop position "B" in the first rotation, distant from the first exposure start position "A" by T/2, the electron beam spot is returned in the inner periphery direction to the next second exposure start position "B1", that the spot is successively moved from there in the outer periphery direction in a second rotation at the same track-pitch/rotation rate, and that, at the end of the second rotation, the spot is returned to the first exposure start position "A". Furthermore, so as to meet the relationship between the rotation of the master disk and the beam intensity shown in FIG. 7 (c) in synchronization with the relationships shown in FIGS. 7 (a) and (b), the beam modulator 52 supplies the beam-deflection electrodes 45 with blanking instructions for maintaining a beam intensity whereby the resist layer becomes sensitive for the groove exposure throughout the first rotation, arranging the electron beam spot to have a pulse-modulated beam intensity according to pre-pit data during the second rotation, and maintaining a beam intensity whereby the resist layer becomes sensitive for groove exposure during the third rotation.

Figure 8:
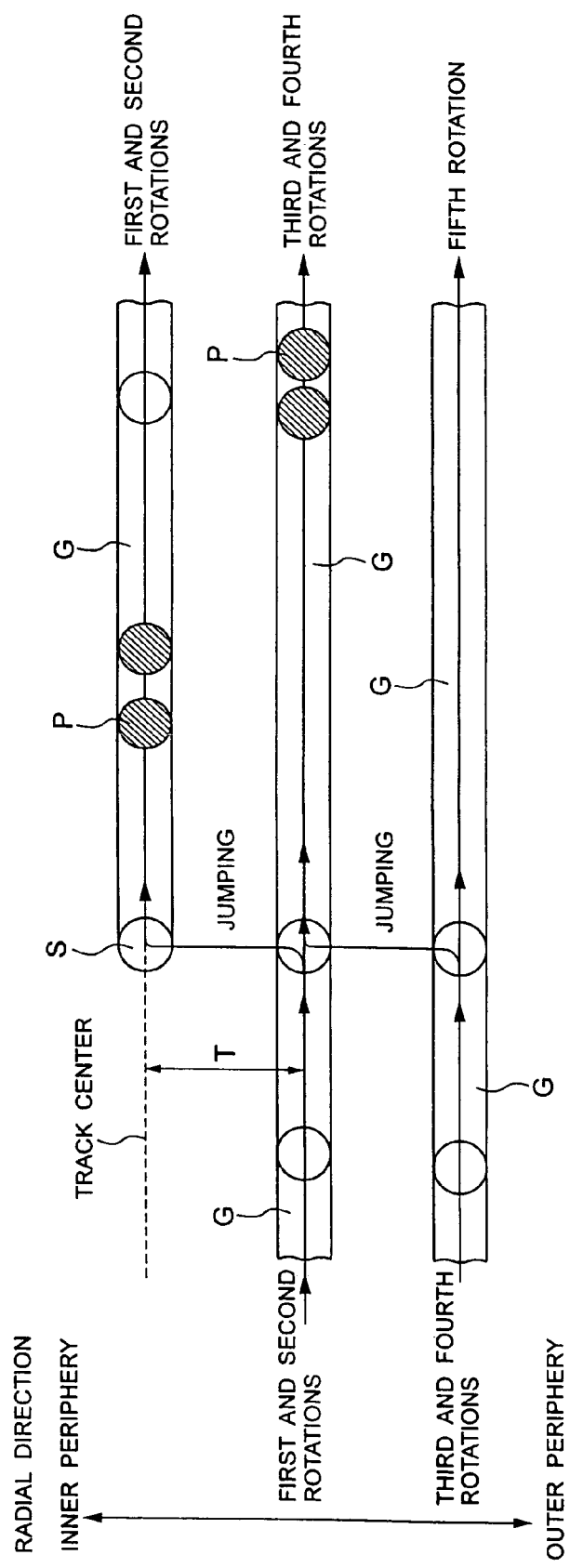
FIG. 8 is an enlarged partial plan view showing the formation of latent images on a master disk in the electron beam recorder according to the second embodiment of the present invention.

As shown in FIG. 8, according to such a series of deflection operations of modulated beam spot, a groove latent image G is formed by the locus of the exposure movement of the electron beam spot S during the first rotation, land pre-pit latent images P are superimposedly formed on the locus of the groove latent image according to pre-pit data during the second rotation, and groove latent images G that are correctly connected after exposure locus during one rotation, are formed during the third rotation. By performing such operations with respect to the entire master disk, an information recording process of forming latent images is completed.

Third Embodiment

In the above embodiments, the predetermined moving amount of the rotation drive section is limited to a track pitch of ½, i.e., T/2, but the moving amount of the master disk according to the present invention is not limited to T/2. Any moving amount of the master disk that is a distance covered by 1/n of one track pitch (where "n" is an integral number) may be adopted. In this case, the moving amount of the electron beam spot is also set at a distance covered by 1/n of one track pitch (where "n" is an integral number) on the radius of the master disk for each rotation thereof. This allows track latent images such as double spirals to be formed.

Figure 9:
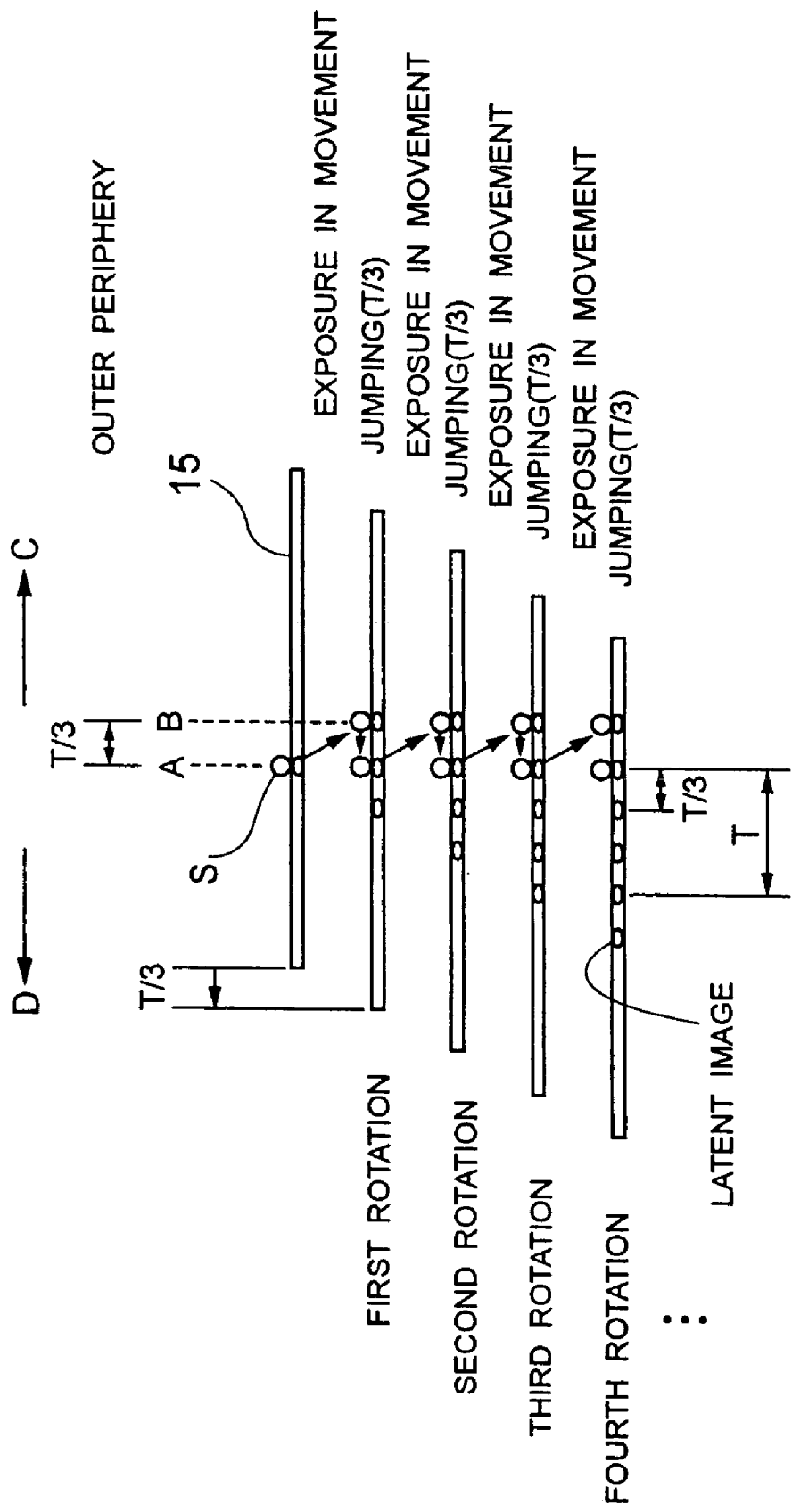
FIG. 9 is a schematic sectional view showing a state wherein information is being recorded on a master dick in the electron beam recorder according to the third embodiment of the present invention.

Specifically, as shown in FIG. 9, while the rotating master disk 15 is moving in the direction "D" by ⅓ track pitches (T/3) for each rotation thereof, at a point in time when the spot has been moved from the first exposure position "A" in the outer periphery direction by T/3, the electron beam spot S arrives at the exposure stop position "B". Here, the spot S is intermittently moved to the first exposure start position as a second exposure start position, and is periodically returned to the exposure stop position "B" for each rotation of the master disk.

Figure 10:
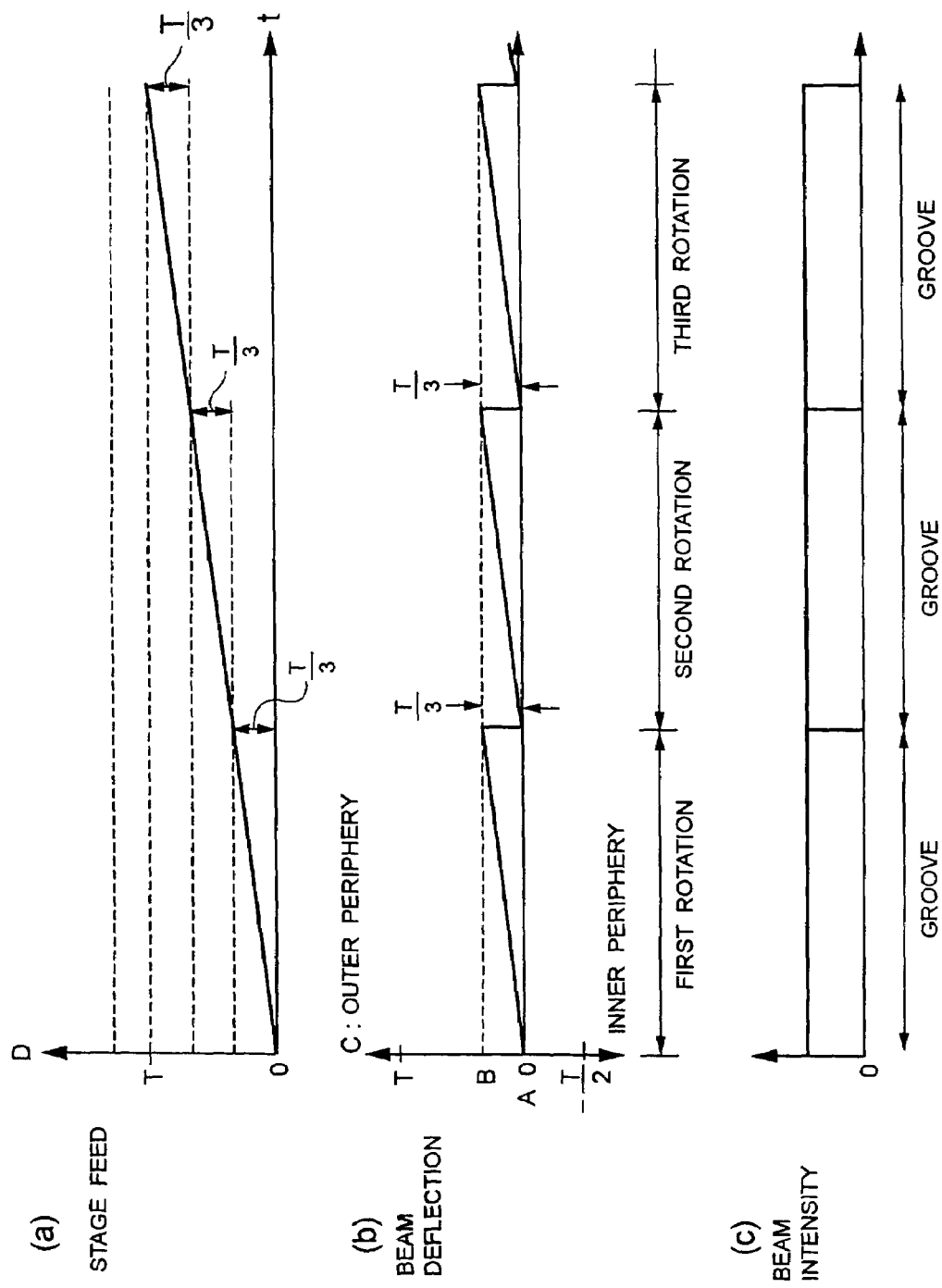
FIG. 10 is a diagram graphing relations between feed operation of a master disk, beam deflection operation, and a beam recording signal in the third embodiment of the present invention.

The disk driving controller 30 shown in FIG. 1 supplies the translational driving mechanism 19 with an instruction for moving the master disk by a predetermined amount T/3 per rotation thereof so as to satisfy the relationship between the rotation of the master disk 15 and the feed amount of the stage shown in FIG. 10 (a). Simultaneously, so as to meet the relationship between the rotation of the master disk 15 and the deflection amount of the beam shown in FIG. 10 (b), the beam deflector 55 supplies the beam-deflection electrodes 45 with instructions in sawtooth waveform for performing deflection operations such that the electron beam spot is successively moved from the first exposure start position "A" in the outer periphery direction opposite to the stage feeding direction by the predetermined moving amount T/3 per rotation of the master disk, that, at an exposure stop position "B" in the first rotation, distant from the first exposure start position "A" by T/3, the spot is periodically returned in the inner periphery direction to a next second exposure start position, namely, the first exposure start position "A", and that the spot is likewise successively moved from there in the outer periphery direction. Furthermore, so as to meet the relationship between the rotation of the master disk and the beam intensity shown in FIG. 10 (c) in synchronization with the relationships shown in FIGS. 10 (a) and (b), that is, so as to set the beam intensity at zero only when the electron beam spot is caused to jump, the beam modulator 52 supplies the beam-deflection electrodes 45 with a blanking instruction for maintaining a beam intensity whereby resist layer becomes sensitive for the groove exposure throughout the first, second, and third rotations.

Figure 11:
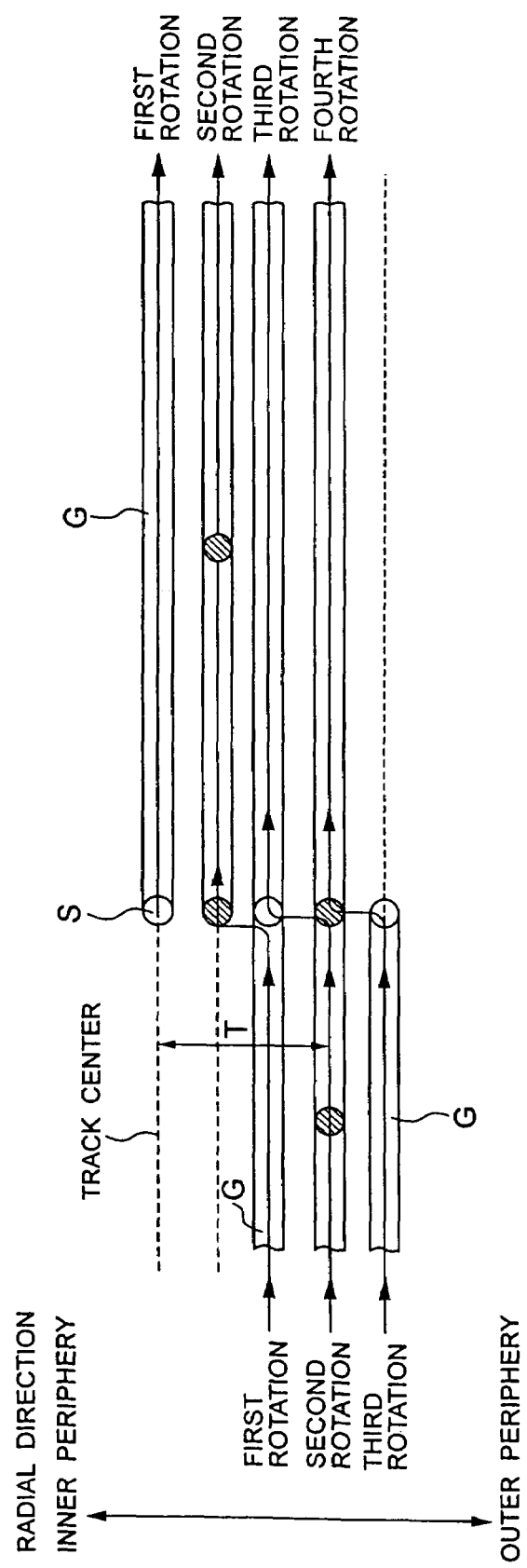
FIG. 11 is an enlarged partial plan view showing the formation of latent images on a master disk in the electron beam recorder according to the third embodiment of the present invention.

By performing such a series of deflection operations of modulated electron beam spot operations with respect to the entire master disk, as shown in FIG. 11, a new double-spiral groove latent image with a track pitch 2T/3 wherein a groove latent image G due to an exposure movement of the spot S during an odd numbered rotation and a groove latent image G during an even numbered rotation are parallel to each other, is formed on the resist layer of the master disk 15, and thereby an information recording process is completed.

Fourth Embodiment

Moreover, according to the present invention, a target optical disk where the groove width thereof is made larger than electron beam spot width can be manufactured. In this case, the second exposure start position "B1" is set to be a position located in the range within the diameter of the spot S about the position that is distant from the exposure stop position "B" by an integral multiple of a distance equivalent to the predetermined moving amount of the rotation drive section, for example, T/2, beyond the first exposure start position "A".

Figure 12:
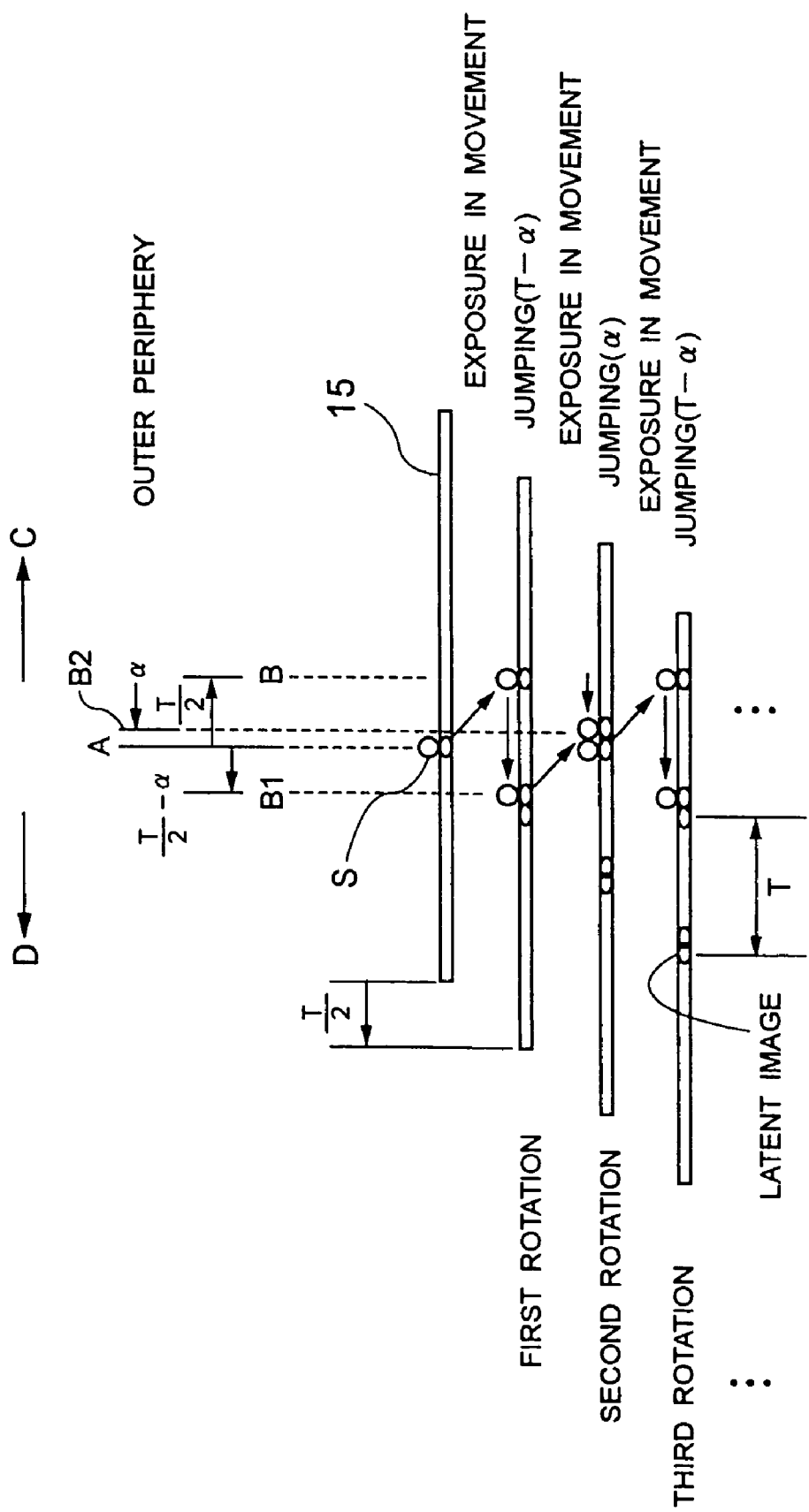
FIG. 12 is a schematic sectional view showing a state wherein information is being recorded on a master dick in the electron beam recorder according to the fourth embodiment of the present invention.

Specifically, as shown in FIG. 12, during the first rotation, while the rotating master disk 15 is moving in the direction "D" by T/2 for each rotation thereof, the electron beam spot S is successively moved from the first exposure start position "A" in the outer periphery direction "C", and at a point in time when the spot has arrived at the exposure stop position "B" distant by T/2 from the first exposure position "A", the spot S is caused to jump to a second exposure start position "B1" in the inner periphery direction (the position distant from the exposure stop position "B" by a distance equivalent to (T/2−α) (here, α is a number smaller than the diameter of the electron beam spot), beyond the first exposure start position "A". During the second rotation, the spot S is successively moved from the second exposure start position "B1" in the outer periphery direction by T/2 per rotation of the master disk, and traces the latent image locus so as to overlap it during the first rotation of the master disk. At the end of the second rotation, that is, at a point in time when the spot that is successively moved from the second exposure start position "B1" in the outer periphery direction has moved up to the second exposure stop position "B2" (the position shifted from the first exposure start position "A" in the outer periphery direction by a), the spot is periodically returned to the first exposure start position "A" by causing the spot to jump. Next, in the third rotation, the beam spot is successively moved. Those operations are periodically repeated.

Figure 13:
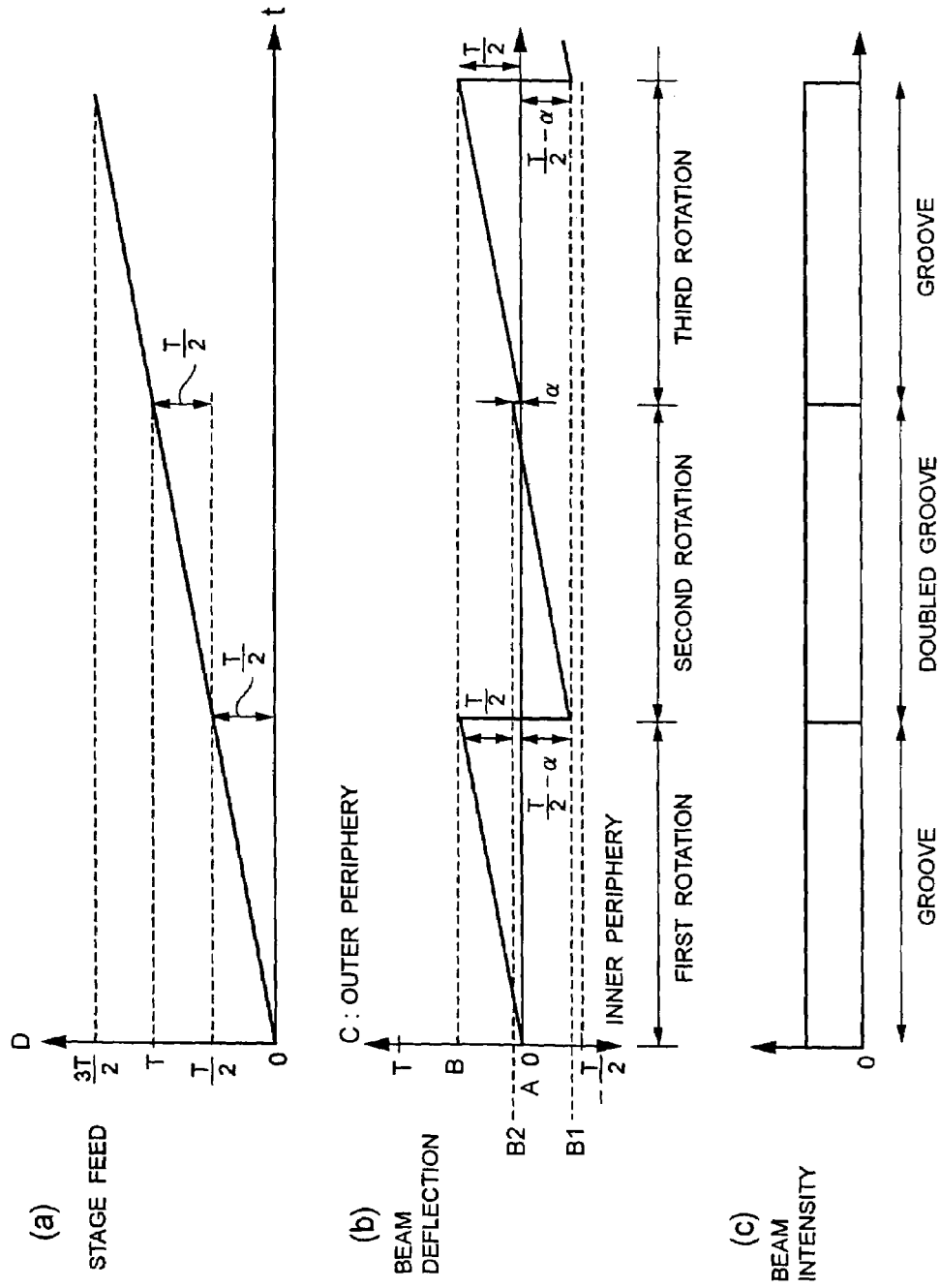
FIG. 13 is a diagram graphing relations between feed operation of a master disk, beam deflection operation, and a beam recording signal in the fourth embodiment of the present invention.

The disk driving controller 30 shown in FIG. 1 supplies the translational driving mechanism 19 with an instruction for moving the master disk by a predetermined amount T/2 per rotation thereof so as to satisfy the relationship between the rotation of the master disk 15 and the feed amount of the stage shown in FIG. 13 (a). Simultaneously, so as to meet the relationship between the rotation of the master disk 15 and the deflection amount of the beam shown in FIG. 13 (b), the beam deflector 55 supplies the beam-deflection electrodes 45 with instructions in sawtooth waveform for performing deflection operations such that the electron beam spot is successively moved from the first exposure start position "A" in the outer periphery direction opposite to the stage feeding direction by the predetermined moving amount T/2 per rotation of the master disk, that, at an exposure stop position "B" in the first rotation, distant from the first exposure start position "A" by T/2, the spot is returned by a jump in the inner periphery direction to a next second exposure start position "B1" (the position distant from the exposure stop position "B" by the predetermined moving amount T/2 minus α), that the spot is successively moved therefrom in the outer periphery direction in the second rotation at the same tracking-pitch/rotation rate, and that, at the end of the second rotation, the spot is caused to jump back in the inner periphery direction to the first exposure start position "A" by a distance equivalent to the shift amount α. Furthermore, so as to meet the relationship between the rotation of the master disk and the beam intensity shown in FIG. 13 (c) in synchronization with the relationships shown in FIGS. 13 (a) and (b), that is, so as to set the beam intensity at zero only when the spot is caused to jump, the beam modulator 52 supplies the beam-deflection electrodes 45 with a blanking instruction for maintaining a beam intensity whereby resist layer becomes sensitive for the groove exposure throughout the first, second, and third rotations.

Figure 14:
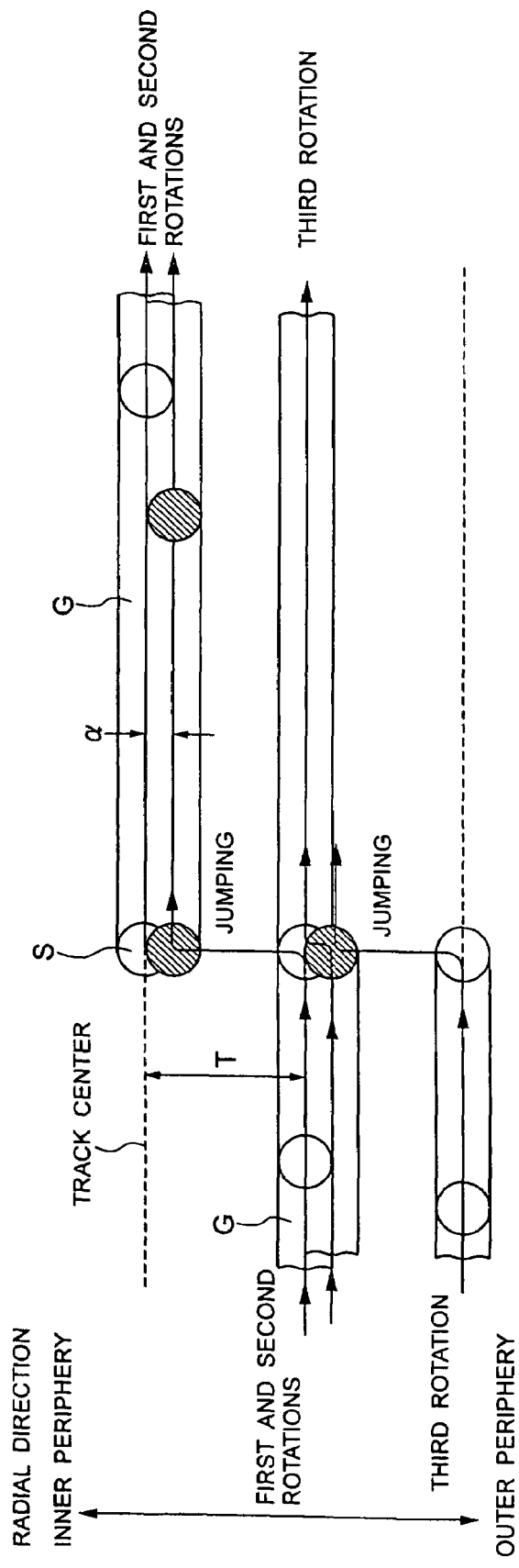
FIG. 14 is an enlarged partial plan view showing the formation of latent images on a master disk in the electron beam recorder according to the fourth embodiment of the present invention.

By performing such a series of deflection operations of modulated beam spot operations with respect to the entire master disk, as shown in FIG. 14, for example, a groove image G having a width 1.5 times as large as the diameter of the spot S is formed when the shift amount α is one-half the spot diameter. Thereby, an information recording process is completed.

Fifth Embodiment

In the above-described embodiments, the groove exposure period and the pre-pit exposure period are arranged to be alternately provided for each rotation. However, these exposure periods needs not be alternately provided for each rotation. The number of the rotations of the master disk from the first exposure start position "A" to the exposure stop position "B" has only to be an integral number. In addition, the number of the disk rotations from the subsequent second exposure start position to the next exposure stop position may also be an integral number.

Figure 15:
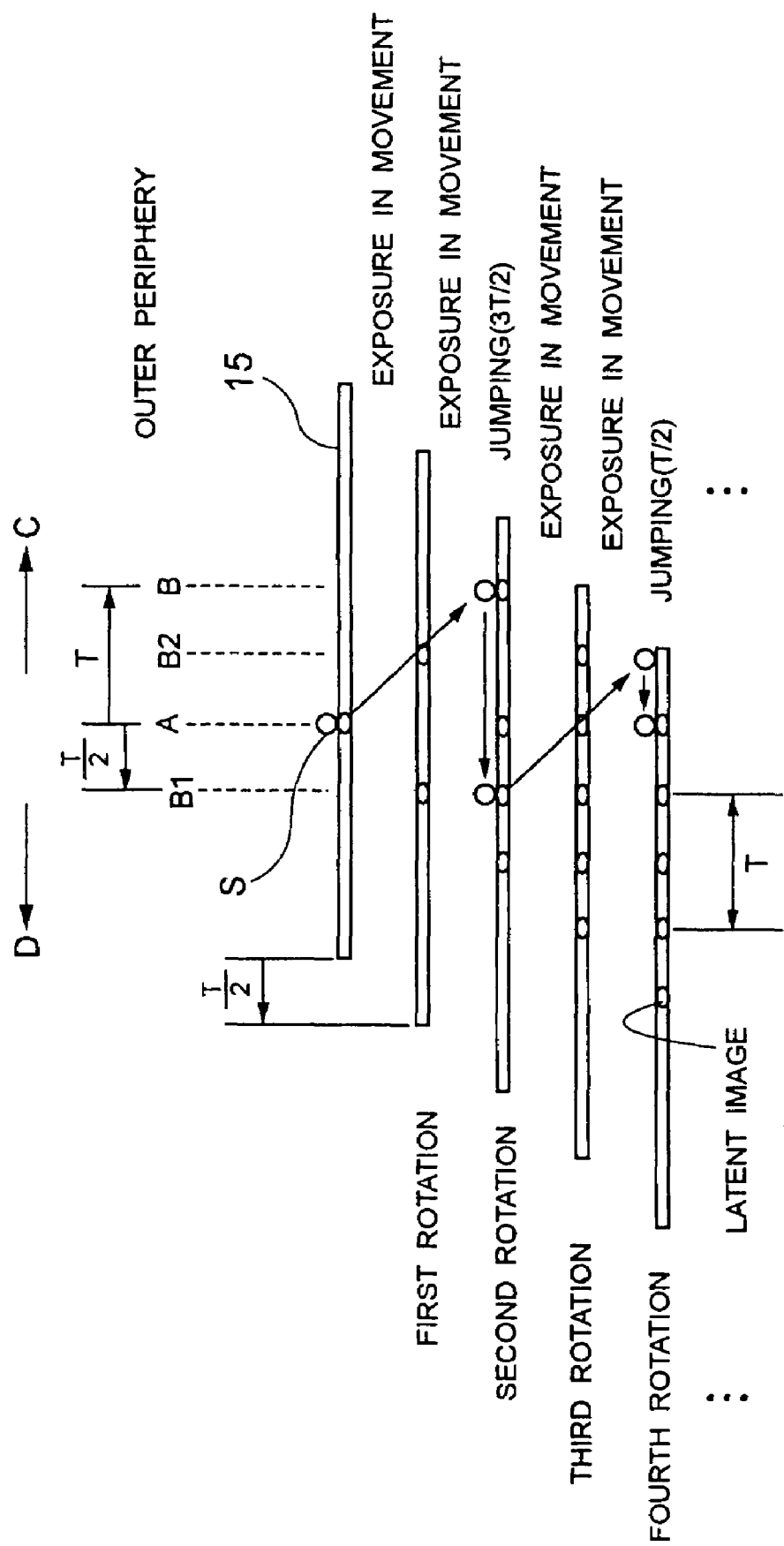
FIG. 15 is a schematic sectional view showing a state wherein information is being recorded on a master dick in the electron beam recorder according to the fifth embodiment of the present invention.

Specifically, as shown in FIG. 15, during first and second rotations, while the rotating master disk 15 is moving in the direction "D" by T/2 for each rotation thereof, the electron beam spot S is successively moved from the first exposure start position "A" in the outer periphery direction "C", and at a point in time when the spot has arrived at the exposure stop position "B" distant by T from the first exposure position "A", the spot S is caused to jump to a second exposure start position "B1" in the inner periphery direction (the position distant from the exposure stop position "B" by a distance equivalent to T/2, beyond the first exposure start position "A"). During subsequent third and fourth rotations, the spot S is successively moved from the second exposure start position "B1" in the outer periphery direction by T/2 per rotation of the master disk. At the end of the fourth rotation, that is, at a point in time when the spot has moved up to the second exposure stop position "B2" (the position shifted from the first exposure start position "A" in the outer periphery direction by T/2), the spot is caused to jump, and is periodically returned to the first exposure start position "A" by causing the spot to jump. Next, these operations are periodically repeated for each four rotations of the master disk.

Figure 16:
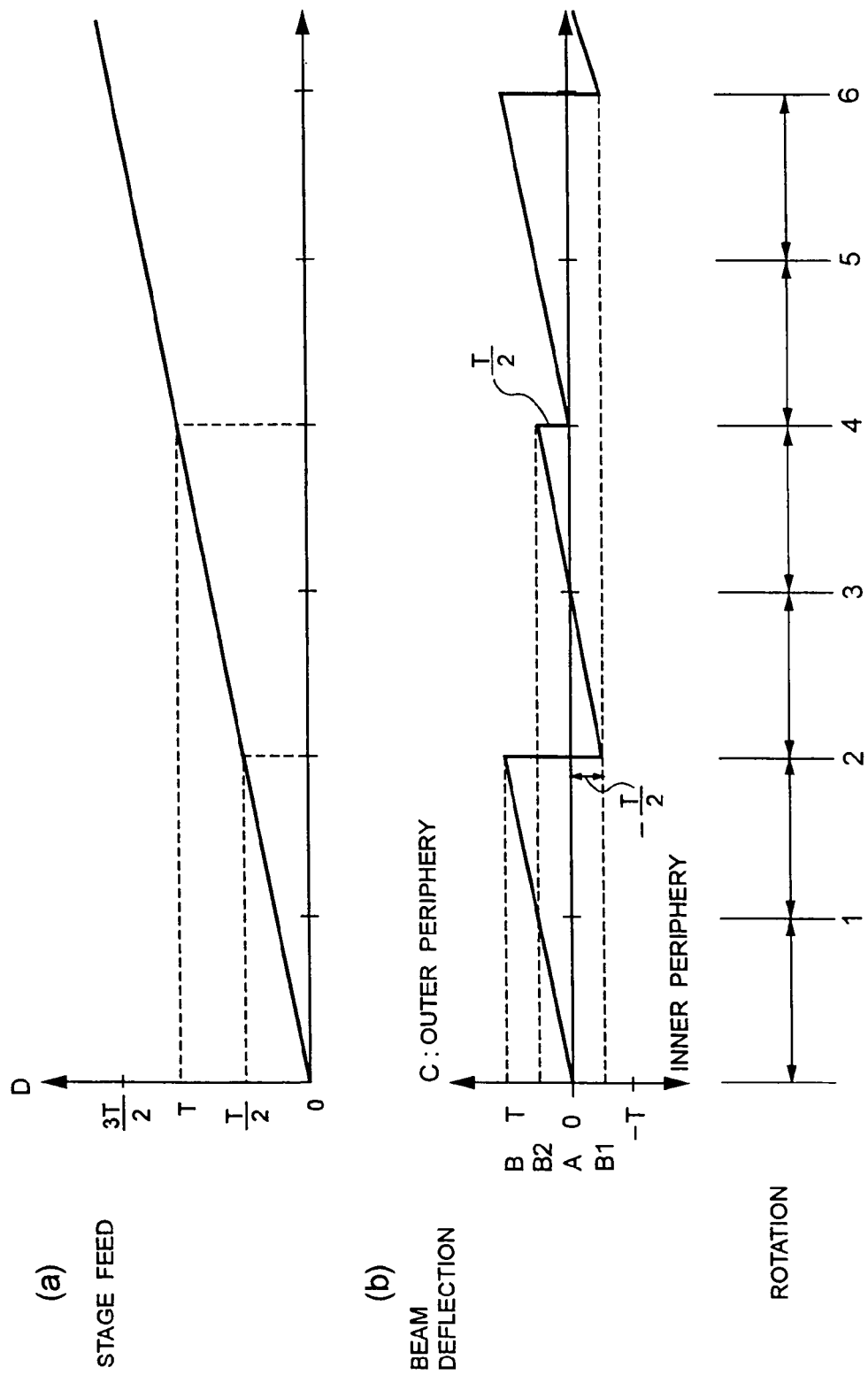
FIG. 16 is a diagram graphing relations between feed operation of a master disk, beam deflection operation, and a beam recording signal in the fifth embodiment of the present invention.

The disk driving controller 30 shown in FIG. 1 supplies the translational driving mechanism 19 with an instruction for moving the master disk by a predetermined amount T/2 per rotation thereof so as to satisfy the relationship between the rotation of the master disk 15 and the feed amount of the stage shown in FIG. 16 (a). Simultaneously, so as to meet the relationship between the rotation of the master disk 15 and the deflection amount of the beam shown in FIG. 16 (b), the beam deflector 55 supplies the beam-deflection electrodes 45 with instructions in sawtooth waveform for performing deflection operations such that the electron beam spot is successively moved from the first exposure start position "A" in the outer periphery direction opposite to the stage feeding direction by the predetermined moving amount T/2 per rotation of the master disk, that, at an exposure stop position "B" in the second rotation, distant from the first exposure start position "A" by T, the spot is returned by a jump in the inner periphery direction to a next second exposure start position "B1" (the position shifted from the first exposure start position "A" by T/2), that the spot is successively moved therefrom in the outer periphery direction in the third rotation at the same tracking-pitch/rotation rate, and that, at the end of the fourth rotation, the spot is caused to jump back to the first exposure start position "A" in the inner periphery direction by T/2 shift amount. Furthermore, in synchronization with the relationships shown in FIGS. 16 (a) and (b), the beam modulator 52 supplies the beam-deflection electrodes 45 with two-rotation period blanking instructions for maintaining a beam intensity whereby the resist layer becomes sensitive for the groove exposure throughout the first, second, fifth, sixth, rotations, and arranging the beam spot to have a pulse-modulated beam intensity according to pre-pit data during the third, fourth, seventh, eighth, rotations.

By performing such a series of deflection operations of modulated beam spot operations with respect to the entire master disk, as in the case of the first embodiment, a recording desk on which groove latent images G and land pre-pits P are formed therebetween is produced, as shown in FIG. 5. In this fifth embodiment, fewer joints of groove latent images G are needed compared with the case of the first embodiment. This results in an improved manufacturing yield.

Sixth Embodiment

In the above-described embodiments, a groove is formed by causing the second exposure start position of the electron beam spot to jump from the exposure stop position in the last rotation by a distance equivalent to the predetermined moving amount T/2 of the rotating master disk, beyond the first exposure start position. Moreover, the present invention allows track recording by setting the position that has been caused to jump, at a position distant from the exposure stop position in the last rotation by an integral multiple nT/2 (where "n" is an integral number) of a distance equivalent to the predetermined moving amount T/2 of the rotating master disk, and by forming groove latent images over a plurality of rotations of the master disk and connecting these groove latent grooves. Here, it is preferable that the exposure stop position be distant from the first exposure start position by an integral multiple of a distance equivalent to the predetermined moving amount of the rotation drive section. This further reduces the number of the joints of groove latent images G, resulting in a more improved manufacturing yield.

Figure 17:
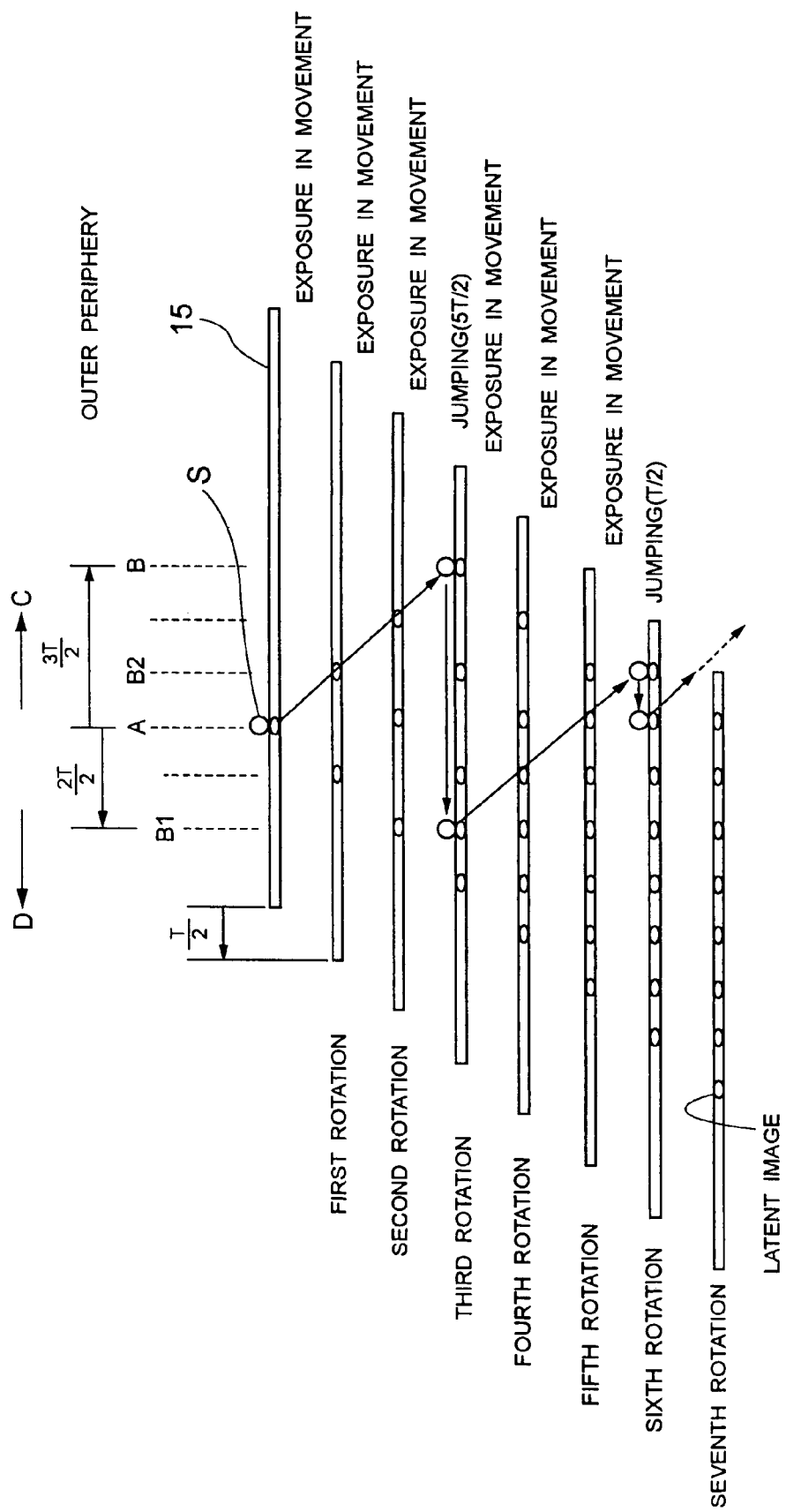
FIG. 17 is a schematic sectional view showing a state wherein information is being recorded on a master dick in the electron beam recorder according to the sixth embodiment of the present invention.

Specifically, as shown in FIG. 17, during first, second, and third rotations, while the rotating master disk 15 is moving in the direction "D" by T/2 for each rotation thereof, the electron beam spot S is successively moved from the first exposure start position "A" in the outer periphery direction "C", and at a point in time when the spot has arrived at the exposure stop position "B" distant by 3T/2 from the first exposure position "A", the spot S is caused to jump to a second exposure start position "B1" in the inner periphery direction (the position distant from the exposure stop position by a distance equivalent to 2T/2, beyond the first exposure start position "A"). During subsequent fourth, fifth, and sixth rotations, the spot S is successively moved from the second exposure start position "B1" in the outer periphery direction by T/2 per rotation of the master disk. At the end of the sixth rotation, that is, at a point in time when the spot has moved up to the second exposure stop position "B2" (the position shifted from the first exposure start position "A" in the outer periphery direction by T/2), the spot is periodically returned to the first exposure start position "A" by causing the spot to jump. Next, these operations are periodically repeated for each six rotations of the master disk.

Figure 18:
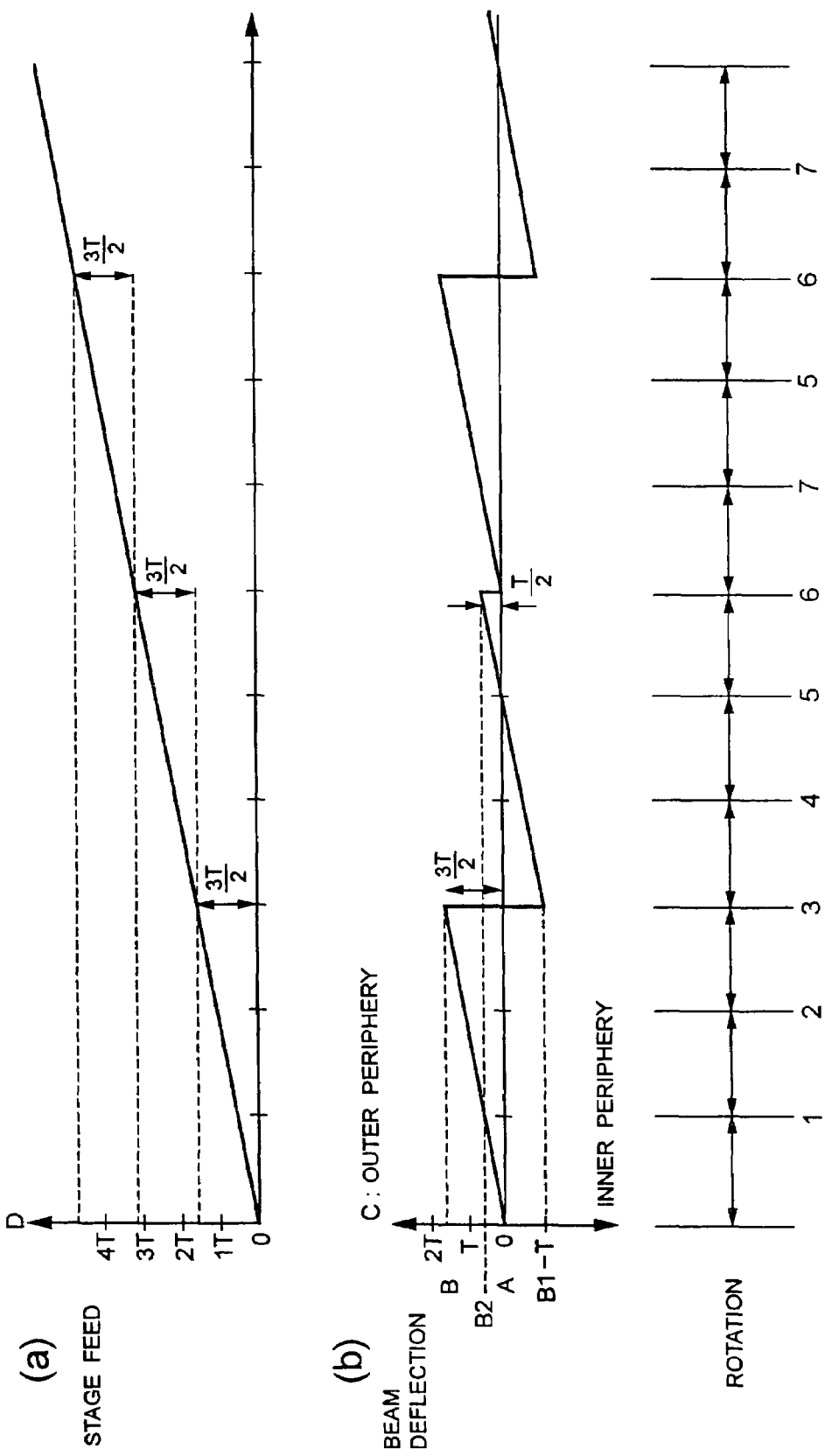
FIG. 18 is a diagram graphing relations between feed operation of a master disk, beam deflection operation, and a beam recording signal in the sixth embodiment of the present invention.

The disk driving controller 30 shown in FIG. 1 supplies the translational driving mechanism 19 with an instruction for moving the master disk by a predetermined amount T/2 per rotation thereof so as to satisfy the relationship between the rotation of the master disk 15 and the feed amount of the stage shown in FIG. 18 (a). Simultaneously, so as to meet the relationship between the rotation of the master disk 15 and the deflection amount of the beam shown in FIG. 18 (b), the beam deflector 55 supplies the beam-deflection electrodes 45 with instructions in sawtooth waveform for performing deflection operations such that the electron beam spot is successively moved from the first exposure start position "A" in the outer periphery direction opposite to the stage feeding direction by the predetermined moving amount T/2 per rotation of the master disk, that, at an exposure stop position "B" in the third rotation, distant from the first exposure start position "A" by 3T/2, the spot is returned back by a jump in the inner periphery direction to a next second exposure start position "B1" (the position shifted from the first exposure start position "A" by 2T/2), that the spot is successively moved therefrom in the outer periphery direction in the fourth rotation at the same tracking-pitch/rotation rate, and that, at the end of the sixth rotation, the spot is caused to jump back to the first exposure start position "A" in the inner periphery direction by T/2. Furthermore, in synchronization with the relationships shown in FIGS. 16 (a) and (b), the beam modulator 52 supplies the beam-deflection electrodes 45 with three-rotation period blanking instructions for maintaining a beam intensity whereby the resist layer becomes sensitive for the groove exposure throughout the first, second, third, seventh, eighth, ninth . . . rotations, and arranging the electron beam spot to have a pulse-modulated beam intensity according to pre-pit data during the fourth, fifth, sixth, tenth, eleventh, twelfth, . . . rotations.

By performing such a series of deflection operations of modulated beam spot operations with respect to the entire master disk, as in the cases of the first and fifth embodiments, a recording desk on which a groove latent image G and land pre-pits P are formed therebetween is produced, as shown in FIG. 5.

Seventh Embodiment

In the above-described third embodiment, by changing the track pitch of the moving amount of the master disk, track latent images of double spirals, which can enhance the track density of the master disk, is formed. In addition, the present invention allows track latent images of multiple spirals to be formed by changing the exposure start point so that latent image loci do not overlap each other.

Figure 19:
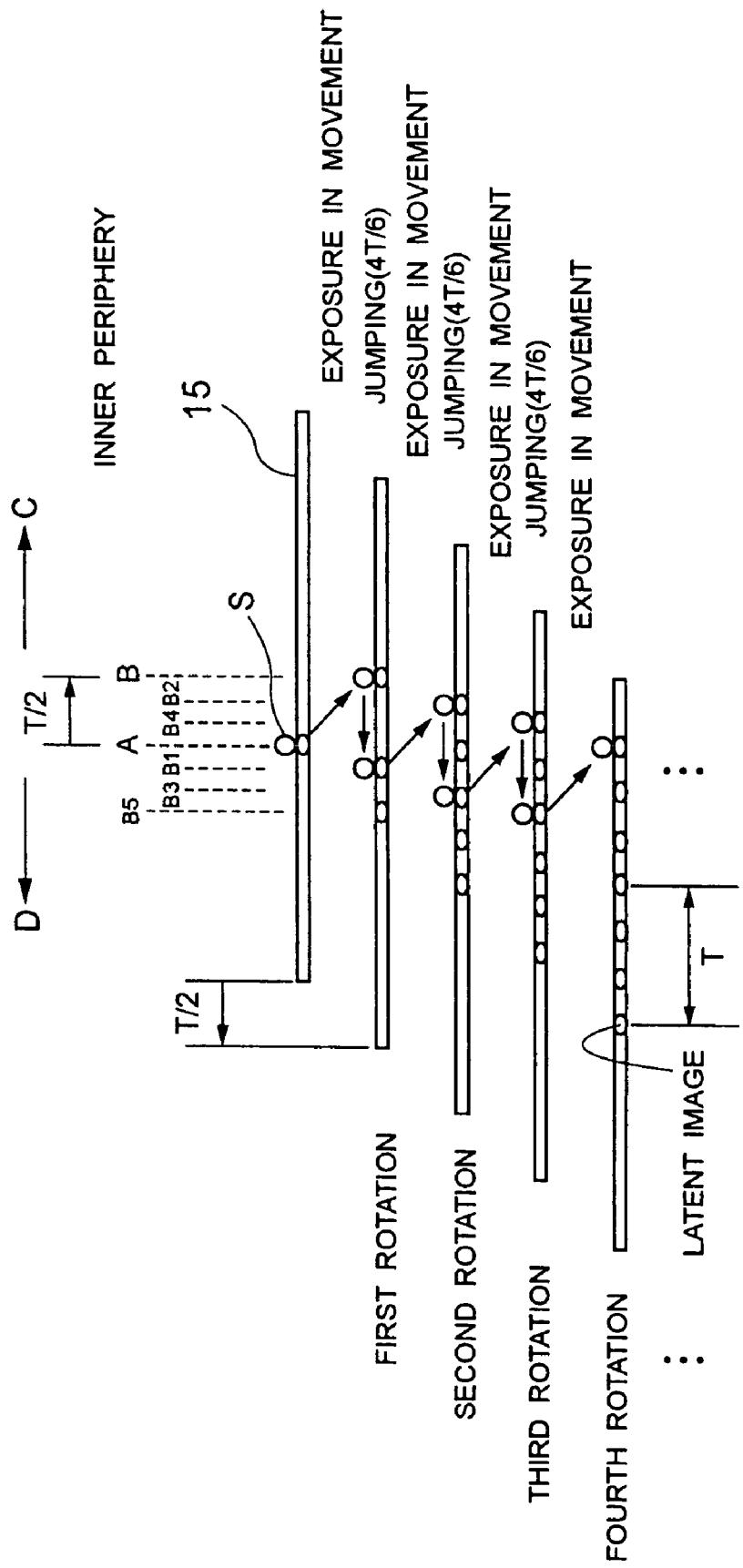
FIG. 19 is a schematic sectional view showing a state wherein information is being recorded on a master dick in the electron beam recorder according to the seventh embodiment of the present invention.

Specifically, as shown in FIG. 19, during first rotation, the rotating master disk 15 is moved in the direction "D" by ½ track pitches (T/2) for each rotation thereof, and at a point in time when the electron beam spot has been moved from the first exposure start position "A" in the opposite direction "C" by T/2 in the outer periphery direction "C", that is, at the exposure stop position "B2", the spot S is caused to jump to a second exposure start position "B1" (the position distant from the exposure stop position by T/6, beyond the first exposure start position "A") at a track-pitch/rotation rate of 4T/6, and during second rotation, the spot S is successively moved from the second exposure start position "B1" in the outer periphery direction by T/2 per rotation of the master disk. At the end of the second rotation, that is, at a second exposure stop point "B2", the spot is caused to jump to a third exposure start position "B3" (the position distant from the second exposure stop position "B2" by 2T/6, beyond the first exposure start position "A") at a tracking-pitch/rotation rate of 4T/6, and during third rotation, the spot S is successively moved from the third exposure start position "B3" in the outer periphery direction by T/2 per rotation. At the end of the third rotation, that is, at the third exposure stop position "B4", the spot is caused to jump to a fourth exposure start position "B5" (the position distant from the third exposure stop position "B4" by 3T/6, beyond the first exposure start position "A") at a track-pitch/rotation rate of 4T/6. Then, the spot S is successively moved from the fourth exposure start position "B5" in the outer periphery direction, and is periodically returned to the first exposure start position "A1". Periodical repeating of these operations allows groove latent images of triple spirals to be recorded.

From another viewpoint, unlike the above-described fourth embodiment, in the present embodiment, the exposure start positions B1, B3, and B4 subsequent to the second exposure start position are located in the range outside the diameter of the electron beam spot about the position that is distant from the corresponding exposure stop position "B" by an integral multiple of a distance equivalent to the predetermined moving amount T/2 of the rotating master disk, beyond the first exposure start position "A", and the locus of the spots and the spot are equidistantly spaced from each other so that the locus of the spots do not overlap with the spot. Thereby, groove latent images with high density can be recorded.

Eighth Embodiment

As a modification of the above-described embodiment, a target optical disk which includes lands having pre-pits and grooves and in which the width of the pre-pits in the radial direction of the optical disk is smaller than that of the grooves in the radial direction thereof can be manufactured.

Figure 20:
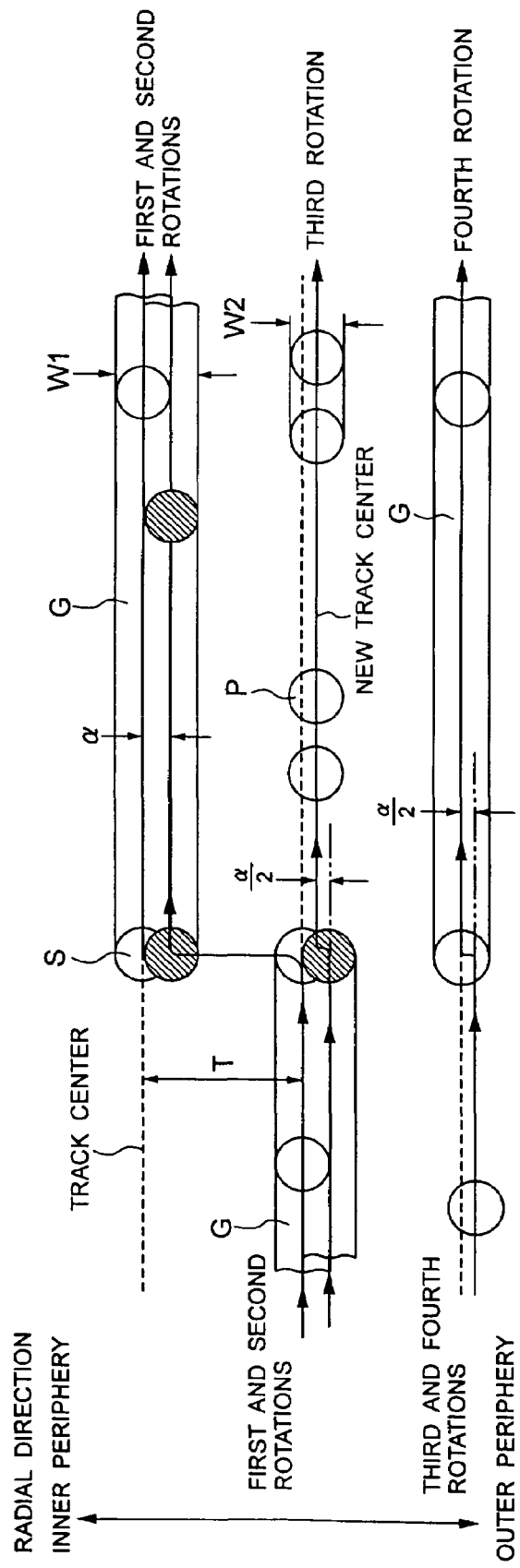
FIG. 20 is an enlarged partial plan view showing the formation of latent images on a master disk in the electron beam recorder according to the eighth embodiment of the present invention.

As shown in FIG. 20, during the first and second rotations of the master disk, latent images are recorded as in the case of the above-described fourth embodiment. During the third rotation, from the second exposure stop position "B2" at the end of the second rotation, shifted from the first exposure start position "A" in the outer periphery direction by α, the electron beam spot is caused to jump back in the inner periphery direction by shift amount ½α, and is successively moved from there in the outer periphery direction in the third rotation at the same track-pitch/rotation rate. At the end of the third rotation, a deflection operation is arranged so that the spot jumps back in the inner periphery direction by the remaining shift amount ½α. Thereby, a master disk in which the pre-pit width in a new track center (½α shift) is smaller than the groove width can be manufactured.

The present invention is arranged to form pits by applying an electron beam by spot irradiation to the recording surface of the master disk in the vacuum chamber, using an electron beam emitting device. However, pits may be recorded by applying a laser beam to the recording surface using a laser emitting device having a laser generator, an optical modulator, a two-dimensional deflector, a mirror, and an objective lens.

As is evident from the foregoing, according to the present invention, by using a single exposure beam, it is possible to form similar latent images to those which have been formed by an exposure device using a plurality of laser light beams, without the need to use a plurality of exposure beams.

Ninth Embodiment

In addition, there will be described of another formation that latent images of pre-pits and grooves are recorded on the rotating master disk so as to be concentrically arranged, using the information recording apparatus of an optical disk according to the present invention.

Figure 21:
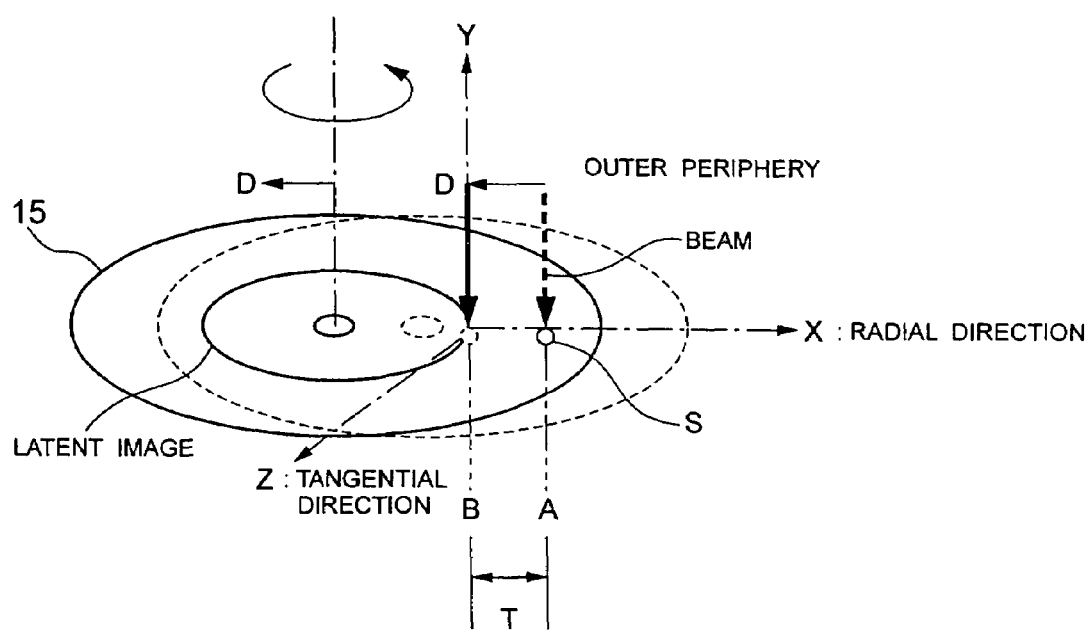
FIG. 21 is a schematic perspective view showing a state wherein information is being recorded on a master dick in the electron beam recorder according to the ninth embodiment of the present invention.

The beam deflector 55 deflects an electron beam by supplying a deflection signal to the beam-deflection electrodes 45, and as shown in FIG. 21, moves the electron beam spot S of the electron beam from an exposure position "A" to an exposure stop position "B" on the radius of the master disk 15 in the same direction "D" of the movable stage 18 (that is, from the outer periphery side to the inner periphery side), at one track pitch each rotation of the master disk 15. Namely, the moving amount of the electron beam spot S on the disk radius for each rotation of the master disk is equal to a moving amount T i.e., one track pitch of the movable stage 18. If there should be a differential in the moving amount between the electron beam spot and the master disk, the gap of the juncture will occur in the radius direction of the master disk. FIG. 21 shows, as an example, a state where the master disk advances by one track pitch at one rotation and the electron beam spot S advances by one track pitch at one rotation. Thereby, concentrically circular latent images are formed with an interval of one track pitch for each rotation of the master disk.

Specifically, as shown in FIG. 22, while the rotating master disk 15 moves by one track pitch T for each rotation thereof in the direction "D", the electron beam column section 40 moves the electron beam spot S by one track pitch T from the exposure start position "A" toward the outer periphery in the same direction "D". When the electron beam spot S has been moved by one track pitch T, the electron beam spot S arrives at the exposure stop position "B". Here, the electron beam spot S is intermittently moved, namely, caused to jump to the exposure start position "A" as an exposure start position, and is also periodically returned to the exposure start position for each rotation of the master disk. In this manner, the main controller 25 and the beam deflector 55, i.e., a deflection controller causes the beam-deflection electrodes 45 to perform such deflection operations according to radial deflection signals. Here, the exposure start position "A" and the exposure stop position "B" are not based on the position of the master disk, but on that of the electron beam column section 40.

The disk driving controller 30 shown in FIG. 1 supplies the translational driving mechanism 19 with an instruction for moving the master disk by one track pitch T per rotation thereof so as to satisfy the relationship between the rotation of the master disk 15 and the feed amount of the stage shown in FIG. 23 (a). Synchronizedly, so as to meet the relationship between the rotation of the master disk 15 and the deflection amount of the beam shown in FIG. 23 (b), the beam deflector 55 supplies the beam-deflection electrodes 45 with instructions in sawtooth waveform for performing deflection operations such that the electron beam spot is successively moved from the exposure start position "A" toward the inner periphery in the same direction as the stage feeding direction by one track pitch T per rotation of the master disk to an exposure stop position "B" in a first rotation and then, the electron beam spot is periodically returned to the next exposure start position "A", and that the electron beam spot is likewise successively moved from there in the inner periphery direction. The exposure start position is a position at which the intensity of the exposure beam according to data to be recorded drops in zero. Furthermore, so as to meet the relationship between the rotation of the master disk and the beam intensity shown in FIG. 23 (c) in synchronization with the relationships shown in FIGS. 23 (a) and (b), the beam modulator 52 supplies the beam-deflection electrodes 45 with blanking instructions for maintaining a beam intensity whereby the resist layer becomes sensitive for the groove exposure throughout the first, second and third rotations.

As shown in FIG. 24, according to such a series of deflection operations of modulated electron beam spot, concentrically circular groove latent images G are formed by the loci of the exposure movements of the spot S during the first, second and third rotation groove latent images G so that each image is correctly as a circle connected after exposure locus during one rotation. By performing such operations with respect to the entire master disk, an information recording process of forming latent images is completed. Furthermore, in the case that the grooves and pre-pits for address information are formed, the electron beam on/off control operation together with the deflection operation are preformed by the beam-deflection electrodes according to the address information to be recorded.

In addition to the manufacturing of optical disk substrate mentioned above, according to the present invention, it is possible to fabricate a magnetic disk, platter of a hard disk or the like by means of the process comprising a step of forming a substrate on which concentrically circular pre-patterns i.e., servo patterns and a step of forming a magnetic recording layer on the substrate.

As is evident from the foregoing, according to the present invention, by using a single exposure beam, it is possible to form the same latent images i.e., concentric circular images as those which have been formed by an exposure device using a plurality of laser light beams, without the need to use a plurality of exposure beams.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on Japanese Patent Applications Nos. 2001-175959 and 2001-175960 which are hereby incorporated by reference.

What is claimed is:

1. An information recording apparatus comprising:
    a rotation drive section that rotates a substrate having a resist layer formed thereon;
    an exposure beam emitting section that applies an exposure beam;
    a movement drive section that moves the rotation drive section in a radial direction of the substrate; and
    a first control section that controls the exposure beam emitting section,
    wherein the first control section controls a beam spot position of the exposure beam in a manner that
    (a) the beam spot is successively moved, from a first exposure start position to an exposure stop position, in an opposite direction to a moving direction of the rotation drive section and then,
    (b) the beam spot is jumped to a second exposure start position in the moving direction of the rotation drive section, when the beam spot moved up to the exposure stop position in predetermined rotation thereof.

2. An information recording apparatus according to claim 1, further comprising:
    a second control section that controls the movement drive section so that the rotation drive section is moved by a predetermined moving amount for each rotation of the rotation drive section.

3. An information recording apparatus according to claim 2, further comprising:
    a third control section that controls the exposure beam emitting section so that an intensity of the exposure beam is modulated according to a concave and convex pattern.

4. An information recording apparatus according to claim 3, wherein a latent image of the concave and convex pattern is produced on the resist layer by the first control section, the second control section and the third control section.

5. An information recording apparatus according to claim 3, wherein the second exposure start position is equal to the first exposure start position.

6. An information recording apparatus according to claim 1, wherein the exposure beam emitting section emits an electron beam as an exposure beam.

* * * * *